(12) United States Patent
Choi et al.

(10) Patent No.: US 12,255,160 B2
(45) Date of Patent: Mar. 18, 2025

(54) SEMICONDUCTOR PACKAGE AND PACKAGE-ON-PACKAGE INCLUDING THE SAME

(71) Applicant: SAMSUNG ELECTRONICS CO., LTD., Suwon-si (KR)

(72) Inventors: Juyoun Choi, Hwaseong-si (KR); Eunjung Lee, Yongin-si (KR); Junho Lee, Suwon-si (KR); Seungsoo Ha, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 422 days.

(21) Appl. No.: 17/742,862

(22) Filed: May 12, 2022

(65) Prior Publication Data
US 2023/0039914 A1 Feb. 9, 2023

(30) Foreign Application Priority Data
Aug. 9, 2021 (KR) .................. 10-2021-0104809

(51) Int. Cl.
| | |
|---|---|
| *H01L 23/538* | (2006.01) |
| *H01L 23/00* | (2006.01) |
| *H01L 23/498* | (2006.01) |
| *H01L 23/64* | (2006.01) |
| *H01L 23/66* | (2006.01) |
| *H01L 25/10* | (2006.01) |

(52) U.S. Cl.
CPC ........ *H01L 23/66* (2013.01); *H01L 23/49816* (2013.01); *H01L 23/5383* (2013.01); *H01L 23/5386* (2013.01); *H01L 23/64* (2013.01); *H01L 24/32* (2013.01); *H01L 25/105* (2013.01); *H01L 2223/6638* (2013.01)

(58) Field of Classification Search
CPC .. H01L 23/64; H01L 23/5386; H01L 23/5383
See application file for complete search history.

(56) References Cited

U.S. PATENT DOCUMENTS

| | | |
|---|---|---|
| 8,669,830 B2 | 3/2014 | Lin |
| 9,704,808 B2 | 7/2017 | Syu et al. |
| 9,997,464 B2 | 6/2018 | Hsieh et al. |
| 10,312,195 B2 | 6/2019 | Lee et al. |
| 10,396,005 B2 | 8/2019 | Kim |
| 10,985,091 B2 | 4/2021 | Choi et al. |

(Continued)

*Primary Examiner* — David A Zarneke
(74) *Attorney, Agent, or Firm* — Sughrue Mion, PLLC

(57) ABSTRACT

Provided is a semiconductor package including a pair of differential signal wiring lines including a first differential signal wiring line and a second differential signal wiring line, extending parallel to and spaced apart from each other, a lower equal potential plate in a lower wiring layer under the signal wiring layer, an upper equal potential plate in an upper wiring layer above the signal wiring layer, and a wiring insulating layer adjacent to the pair of differential signal wiring lines, the lower equal potential plate, and the upper equal potential plate, the wiring insulating layer filling spaces between the signal wiring layer, the lower wiring layer, and the upper wiring layer, at least one of the lower equal potential plate and the upper equal potential plate including an impedance opening overlapping the pair of differential signal wiring lines in a vertical direction and is filled by the wiring insulating layer.

20 Claims, 22 Drawing Sheets

(56) References Cited

U.S. PATENT DOCUMENTS

| | | |
|---|---|---|
| 2020/0203325 A1 | 6/2020 | Lee et al. |
| 2023/0135774 A1* | 5/2023 | Nakajima ............ H01L 23/5226 257/774 |
| 2023/0317640 A1* | 10/2023 | Choi ....................... H01L 23/64 257/668 |

* cited by examiner

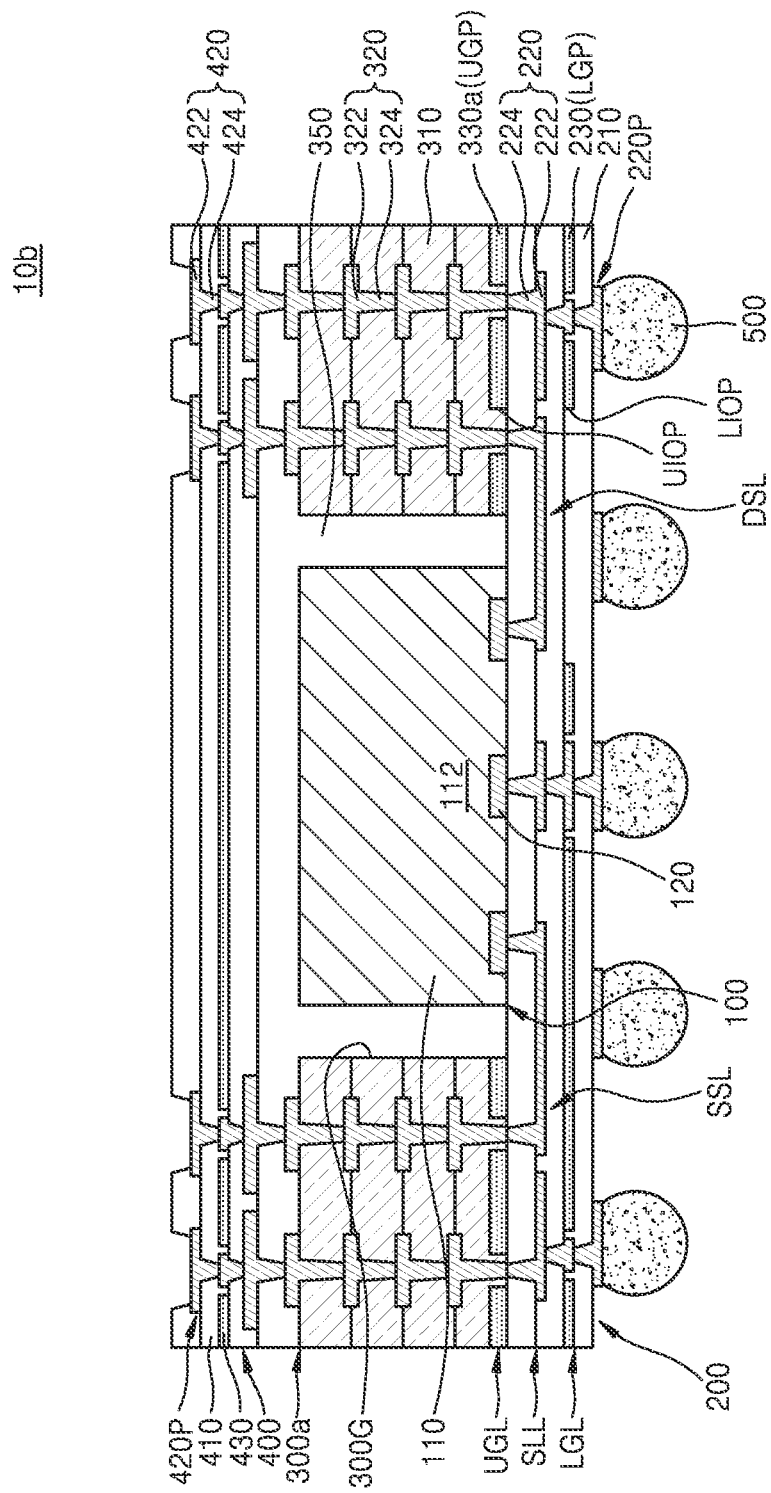

SEMICONDUCTOR PACKAGE AND PACKAGE-ON-PACKAGE INCLUDING THE SAME

CROSS-REFERENCE TO RELATED APPLICATION

This application is based on and claims priority under 35 U.S.C. § 119 to Korean Patent Application No. 10-2021-0104809, filed on Aug. 9, 2021, in the Korean Intellectual Property Office, the disclosure of which is incorporated by reference herein in its entirety.

BACKGROUND

Example embodiments of the present disclosure relate to a semiconductor package and a package-on-package (PoP) including the same, and more particularly, to a fan-out semiconductor package and a PoP including the same.

With the rapid development of the electronics industry and the needs of users, electronic devices have become smaller, more multifunctional, and larger in capacity, and thus, highly integrated semiconductor chips have been required.

Therefore, semiconductor packages having connection terminals having good connection reliability have been devised to obtain a highly integrated semiconductor chip in which the number of connection terminals for input/output (I/O) operations is increased. For example, to prevent interference between the connection terminals, a fan-out semiconductor package in which a distance between the connection terminals is increased has been developed.

SUMMARY

One or more example embodiments provide a semiconductor package having an improved signal integrity (SI) and a package-on-package (PoP) including the semiconductor package.

According to an aspect of an example embodiment, there is provided a semiconductor package including a pair of differential signal wiring lines in a signal wiring layer, the pair of differential signal wiring lines including a first differential signal wiring line and a second differential signal wiring line which extend parallel to and spaced apart from each other, a lower equal potential plate in a lower wiring layer that is under the signal wiring layer, an upper equal potential plate in an upper wiring layer that is above the signal wiring layer opposite to the lower equal potential plate, and a wiring insulating layer adjacent to the pair of differential signal wiring lines, the lower equal potential plate, and the upper equal potential plate, wherein the wiring insulating layer fills spaces between the signal wiring layer, the lower wiring layer, and the upper wiring layer, and wherein at least one of the lower equal potential plate and the upper equal potential plate includes an impedance opening which overlaps the pair of differential signal wiring lines in a vertical direction and is filled by the wiring insulating layer.

According to another aspect of an example embodiment, there is provided a semiconductor package including a lower redistribution layer including a plurality of lower redistribution line patterns, a plurality of lower redistribution via patterns, a lower equal potential plate, a lower redistribution insulating layer adjacent to the plurality of lower redistribution line patterns, the plurality of lower redistribution via patterns, and the lower equal potential plate, a signal wiring layer, and a lower wiring layer under the signal wiring layer, wherein a pair of differential signal wiring lines are portions of the plurality of lower redistribution line patterns in the signal wiring layer, and the lower equal potential plate is in the lower wiring layer, and wherein the pair of differential signal wiring lines include a first differential signal wiring line and a second differential signal wiring line, which extend spaced apart from each other, an expanded layer overlapping portions of the pair of differential signal wiring lines in a vertical direction, the expanded layer including a substrate base having a mounting space, a plurality of wiring patterns and an upper equal potential plate on at least one of a top surface and a bottom surface of the substrate base, a plurality of conductive vias passing through at least a portion of the substrate base, and an upper wiring layer in which the upper equal potential plate is provided, the upper wiring layer being above the signal wiring layer, and a semiconductor chip in the mounting space on the lower redistribution layer, wherein the lower equal potential plate and the upper equal potential plate respectively have a lower impedance opening and an upper impedance opening, and wherein the lower impedance opening and the upper impedance opening overlap at least portions of the pair of differential signal wiring lines in the vertical direction.

According to another aspect of an example embodiment, there is provided a semiconductor package-on-package including a first semiconductor package including a lower redistribution layer including a surrounding equal potential plate including a differential signal opening, a signal wiring layer in the differential signal opening, a lower wiring layer including a lower equal potential plate, under the signal wiring layer, a pair of differential signal wiring lines in the signal wiring layer, the pair of differential signal wiring lines including a first differential signal wiring line and a second differential signal wiring line, which extend spaced apart from each other, and a lower redistribution insulating layer adjacent to the surrounding equal potential plate, the pair of differential signal wiring lines, and the lower equal potential plate, an expanded layer overlapping portions of the pair of differential signal wiring lines in a vertical direction on the lower redistribution layer, the expanded layer including a substrate base including a mounting space, a plurality of wiring patterns and an upper equal potential plate on at least one of a top surface of the substrate base and a bottom surface of the substrate base, and a plurality of conductive vias passing through at least a portion of the substrate base, an upper wiring layer in which the upper equal potential plate is provided above the signal wiring layer, a first semiconductor chip in the mounting space on the lower redistribution layer, and an upper redistribution layer on the expanded layer and the first semiconductor chip, the upper redistribution layer including a plurality of upper redistribution line patterns, a plurality of upper redistribution via patterns, and an upper redistribution insulating layer adjacent to the plurality of upper redistribution line patterns and the plurality of upper redistribution via patterns, and a second semiconductor package including a second semiconductor chip electrically connected to the first semiconductor chip through the pair of differential signal wiring lines, and package connection terminals on to package connection pads to electrically connect the second semiconductor chip to the first semiconductor package, wherein the second semiconductor package is on the first semiconductor package, and wherein the package connection pads are portions of the plurality of upper redistribution via patterns, wherein the lower equal potential plate and the upper equal potential plate respectively have a lower impedance opening and an upper impedance opening which overlap at least portions of the pair of differential signal wiring lines in the vertical direction, wherein the lower redistribution layer further includes a lower equal potential bridge extending to bisect the lower impedance opening, the lower equal potential bridge being integrally formed with the lower equal potential plate, wherein the expanded layer further includes an upper equal potential bridge extending to bisect the upper impedance opening, the upper equal potential bridge being integrally formed with the upper equal potential plate, and wherein the lower equal potential bridge and the upper equal potential bridge overlap a space between the first differential signal wiring line and the second differential signal wiring line in the vertical direction.

BRIEF DESCRIPTION OF THE DRAWINGS

Example embodiments will be more clearly understood from the following detailed description taken in conjunction with the accompanying drawings in which:

FIGS. 5A and 5B are cross-sectional views of a semiconductor package according to example embodiments.

DETAILED DESCRIPTION

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present.

Figure 1:
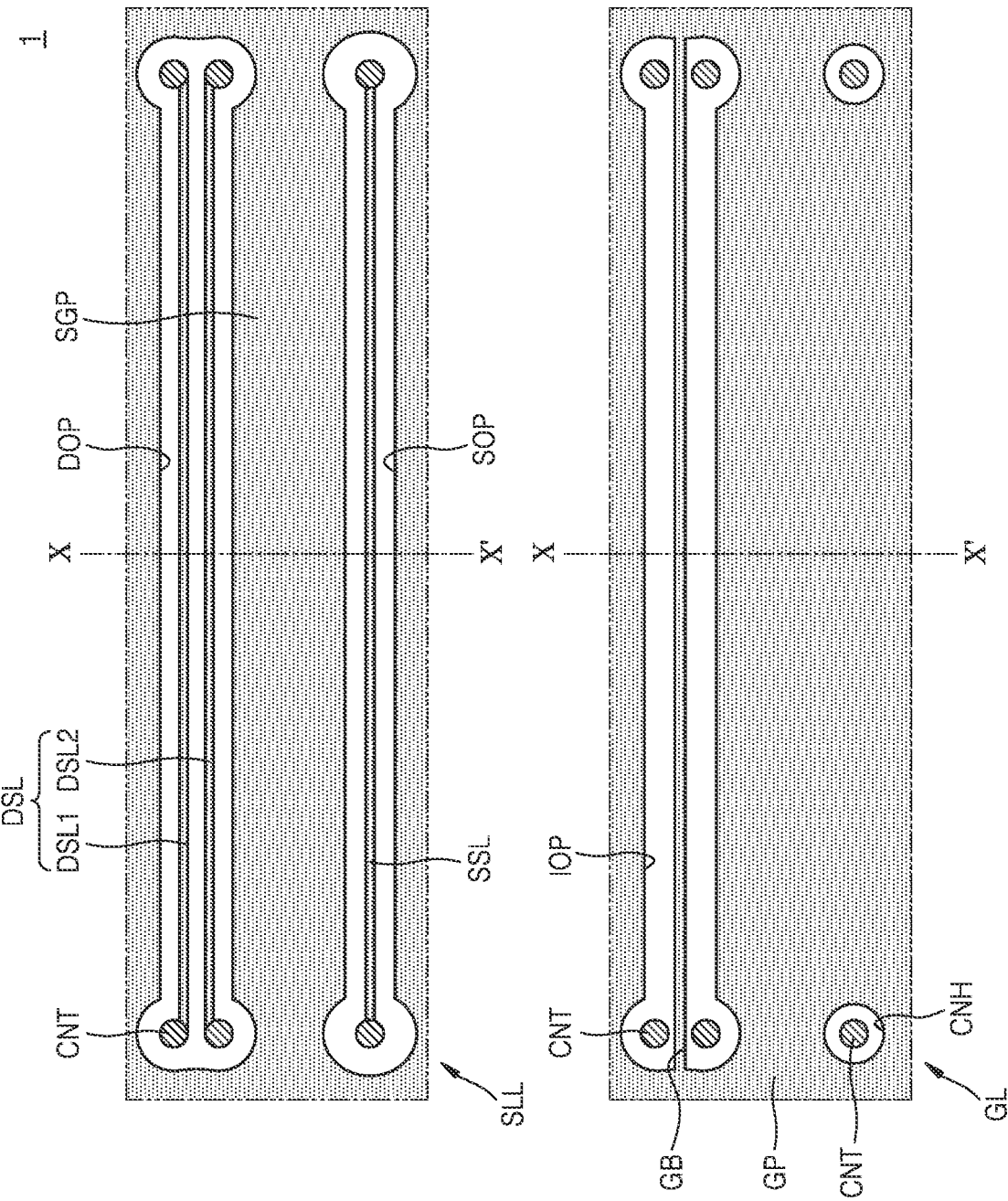
FIG. 1 shows plan views of line patterns included in semiconductor package according to example embodiments.

FIG. 1 shows plan views of line patterns included in a semiconductor package 1, according to example embodiments. Specifically, FIG. 1 shows plan views of different wiring layers.

Referring to FIG. 1, the semiconductor package 1 may include a signal wiring line layer SLL and a wiring layer GL. The signal wiring line layer SLL may correspond to one of signal wiring layers SLL of semiconductor packages 1a, 1b, 1c, 1d, 1e, 1f, 1g, 1h, 1i, 1j, 1k, and 1l shown in FIGS. 2A to 2L, and the wiring layer GL may correspond to an upper wiring layer UGLa, UGL, UGLd, UGLg, UGLh, UGLi, UGLj, UGLk, or UGLl or a lower wiring layer LGLa, LGL, LGLd, LGLg, LGLh, LGLi, LGLj, LGLk, or LGLl.

As used herein, each of the signal wiring line layer and the wiring layer may be a layer having circuit wirings configured to form an electrical path on the same plane. As used herein, the signal wiring line layer may be a layer in which signal wiring lines are mainly located, and the wiring layer may be a layer in which an equal potential plate is mainly located. The equal potential plate may be a power plate to which power is applied or a ground plate to which ground is applied. For example, only the signal wiring line may be in the signal wiring line layer, or the equal potential plate may be in the signal wiring layer along with a relatively large number of signal wiring lines. For example, only the equal potential plate may be in the wiring layer, or a relatively small number of signal wiring lines may be in the wiring layer along with the equal potential plate.

The signal wiring line layer SLL and the wiring layer GL may be wiring layers located at different vertical levels. The signal wiring line layer SLL shown in FIG. 1 may overlap the wiring layer GL in a vertical direction.

A pair of differential signal wiring lines DSL and a single signal wiring line SSL may be in the single wiring line layer SLL. The pair of differential signal wiring lines DSL may include a first differential signal wiring line DSL1 and a second differential signal wiring line DSL2 to which signals that are opposite in phase to each other are applied. The first differential signal wiring line DSL1 and the second differential signal wiring line DSL2 may extend parallel to each other in a lateral direction and are spaced apart from each other. The single signal wiring line SSL may be spaced apart from the pair of differential signal wiring lines DSL and extend in the lateral direction. Although FIG. 1 illustrates an example in which each of the first differential signal wiring line DSL1, the second differential signal wiring line DSL2, and the single signal wiring line SSL extends in one direction, embodiments are not limited thereto. Each of the first differential signal wiring line DSL1, the second differential signal wiring line DSL2, and the single signal wiring line SSL may extend in various directions intersecting with the vertical direction or may be refracted and extend in the signal wiring line layer SLL in the same plane.

In example embodiments, a surrounding equal potential plate SGP may be in the signal wiring line layer SLL. The surrounding equal potential plate SGP may be spaced apart from each of the pair of differential signal wiring lines DSL and the single signal wiring line SSL and be provided adjacent to and surround the pair of differential signal wiring lines DSL and the single signal wiring line SSL. The surrounding equal potential plate SGP may have a differential signal opening DOP and a single signal opening SOP. The surrounding equal potential plate SGP may be an equal potential plate surrounding and provided adjacent to the signal wiring line in a horizontal direction. The pair of differential signal wiring lines DSL may be inside the differential signal opening DOP, and the single signal wiring line SSL may be inside the single signal opening SOP. Although FIG. 1 illustrates an example in which one single signal wiring line SSL is inside the single signal opening SOP, embodiments are not limited thereto. For example, a plurality of single signal wiring lines SSL, which are spaced apart from each other, may be in the single signal opening SOP.

Contact plugs CNT may be respectively connected to both ends of each of the first differential signal wiring line DSL1 and the second differential signal wiring line DSL2, which are included in the pair of differential signal wiring lines DSL, and the single signal wiring line SSL. The contact plug CNT may extend in the vertical direction and electrically connect wiring lines located at different vertical levels.

An equal potential plate GP may be in the wiring layer GL. The equal potential plate GP may have an impedance opening IOP corresponding to the differential signal opening DOP. At least a portion of the impedance opening IOP may overlap the differential signal opening DOP in the vertical direction. At least a portion of the impedance opening TOP may overlap each of the first differential signal wiring line DSL1 and the second differential signal wiring line DSL2 included in the pair of differential signal wiring lines DSL in the vertical direction. For example, at least a portion of each of the first differential signal wiring line DSL1 and the second differential signal wiring line DSL2 may overlap the impedance opening TOP in the vertical direction between the both ends thereof, which are connected to the contact plugs CNT.

The contact plugs CNT connected to the both ends of each of the first differential signal wiring line DSL1 and the second differential signal wiring line DSL2, which are included in the pair of differential signal wiring lines DSL, may extend in the vertical direction through the impedance opening IOP.

In example embodiments, an equal potential bridge GB may be in the wiring layer GL and extend to bisect the impedance opening IOP. The equal potential bridge GB may overlap a space between the first differential signal wiring line DSL1 and the second differential signal wiring line DSL2 included in the pair of differential signal wiring lines DSL in the vertical direction. The equal potential bridge GB may extend from one end connected to a portion of the equal potential plate GP to another end connected to another portion of the equal potential plate GP through a space between the contact plugs CNT respectively connected to ends of the first differential signal wiring line DSL1 and the second differential signal wiring line DSL2 and a space between the contact plugs CNT respectively connected to other ends thereof. In example embodiments, ground may be applied to the equal potential plate GP and the equal potential bridge GB, which are connected to each other. In other example embodiments, power may be applied to the equal potential plate GP and the equal potential bridge GB, which are connected to each other. The equal potential bridge GB may be spaced apart from the contact plug CNT. The equal potential plate GP may be integrally formed with the equal potential bridge GB. In other example embodiments, the equal potential plate GP may not include the equal potential bridge GB.

The equal potential plate GP may have contact openings CNH through which contact plugs CNT connected to the both ends of the single signal wiring line SSL pass. Of the single signal wiring line SSL, the remaining portion other than portions of the both ends connected to the contact plugs CNT may overlap the equal potential plate GP in the vertical direction.

The contact plugs CNT connected to the both ends of the single signal wiring line SSL may be referred to as single signal contact plugs, while the contact plugs CNT connected to the both ends of each of the first differential signal wiring line DSL1 and the second differential signal wiring line DSL2, which are included in the pair of differential signal wiring lines DSL, may be referred to as differential signal contact plugs.

In example embodiments, the semiconductor package 1 may have the wiring layers GL above and under the signal line wiring layer SLL, respectively. The wiring layer GL above the signal line wiring layer SLL may be referred to as an upper wiring layer, while the wiring layer GL under the signal line wiring layer SLL may be referred to as a lower wiring layer.

Each of the signal line wiring layer SLL and the wiring layer GL may include a wiring layer of a printed circuit board (PCB) or a wiring layer of a redistribution layer. In example embodiments, each of the signal line wiring layer SLL, the upper wiring layer, and the lower wiring layer may include a wiring layer of a PCB. In other example embodiments, each of the signal line wiring layer SLL, the upper wiring layer, and the lower wiring layer may include a wiring layer of a redistribution layer. In other example embodiments, some of the signal line wiring layer SLL, the upper wiring layer, and the lower wiring layer may be wiring layers of a PCB, while the remaining ones thereof may be wiring layers of a redistribution layer.

Each of the first differential signal wiring line DSL1, the second differential signal wiring line DSL2, the single signal wiring line SSL, the surrounding equal potential plate SGP, the equal potential plate GP, and the contact plug CNT may include a metal, such as, for example, copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), an alloy thereof, stainless steel, or beryllium copper, without being limited thereto.

FIGS. 2A to 2L are respectively plan views of line patterns included in semiconductor packages according to example embodiments. Specifically, FIGS. 2A to 2L are cross-sectional views taken along a portion corresponding to line X-X' of FIG. 1. In FIGS. 2A to 2L, the same element names as in FIG. 1 denote substantially the same elements or modified elements, the same reference numerals as in FIG. 1 denote substantially the same elements, and the same descriptions as in FIG. 1 may be omitted.

Figure 2A:
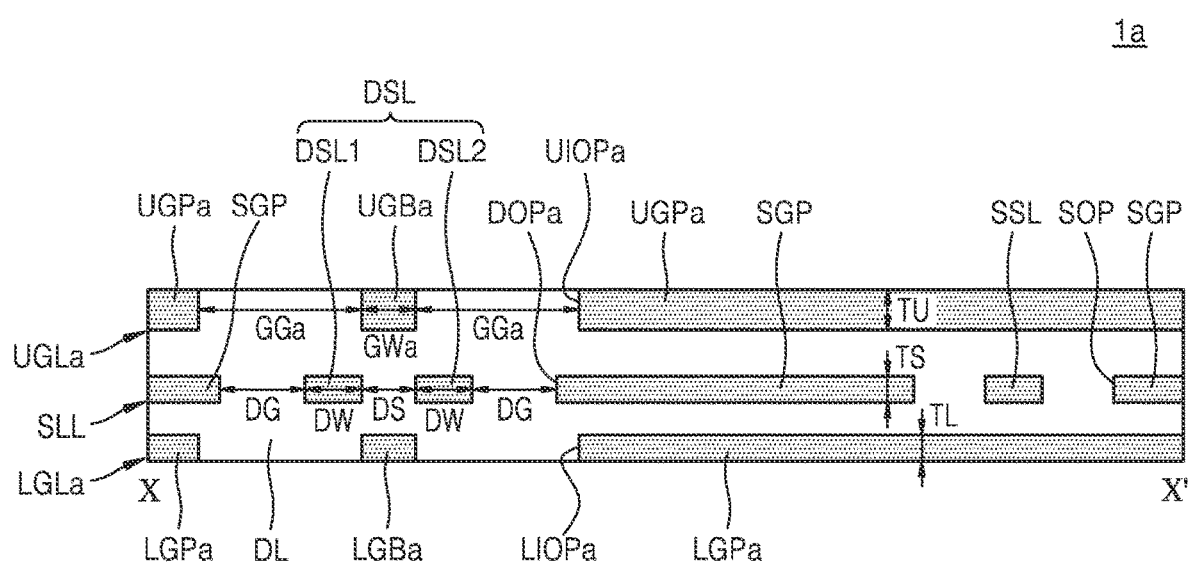
FIGS. 2A, 2B, 2C, 2D, 2E, 2F, 2G, 2H, 2I, 2J, 2K, and 2L are respectively plan views of line patterns included in semiconductor packages according to example embodiments.

Referring to FIG. 2A, the semiconductor package 1a may include a signal wiring layer SLL, and an upper wiring layer UGLa and a lower wiring layer LGLa, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPa and an upper equal potential bridge UGBa may be in the upper wiring layer UGLa, and a lower equal potential plate LGPa and a lower equal potential bridge LGBa may be in the lower wiring layer LGLa.

The surrounding equal potential plate SGP may have a differential signal opening DOPa and a single signal opening SOP. The pair of differential signal wiring lines DSL may be inside the differential signal opening DOPa, and the single signal wiring line SSL may be inside the single signal opening SOP. The pair of differential signal wiring lines DSL may include a first differential signal wiring line DSL1 and a second differential signal wiring line DSL2 to which signals that are opposite in phase to each other are applied. The first differential signal wiring line DSL1 and the second differential signal wiring line DSL2 may extend parallel to each other in a lateral direction and are spaced apart from each other. The single signal wiring line SSL may be apart from the pair of differential signal wiring lines DSL and extend in the lateral direction.

The upper equal potential plate UGPa and the lower equal potential plate LGPa may respectively have an upper impedance opening UIOPa and a lower impedance opening LIOPa, which correspond to the differential signal opening DOPa. At least a portion of each of the upper impedance opening UIOPa and the lower impedance opening LIOPa may overlap the differential signal opening DOPa in a vertical direction. In example embodiments, the differential signal opening DOPa may entirely overlap the upper impedance opening UIOPa and the lower impedance opening LIOPa in the vertical direction. Each of the first differential signal wiring line DSL1 and the second differential signal wiring line DSL2, which are included in the pair of differential signal wiring lines DSL, may entirely overlap each of the upper impedance opening UIOPa and the lower impedance opening LIOPa in the vertical direction.

The upper equal potential bridge UGBa may be in the upper wiring layer UGLa and extend to bisect the upper impedance opening UIOPa. The lower equal potential bridge LGBa may be in the lower wiring layer LGLa and extend to bisect the lower impedance opening LIOPa. Each of the upper equal potential bridge UGBa and the lower equal potential bridge LGBa may overlap a space between the first differential signal wiring line DSL1 and the second differential signal wiring line DSL2, which are included in the pair of differential signal wiring lines DSL, in the vertical direction.

Planar shapes of the upper impedance opening UIOPa and the upper equal potential bridge UGBa may be substantially the same as those of the lower impedance opening LIOPa and the lower equal potential bridge LGBa. For example, the upper impedance opening UIOPa may overlap the lower impedance opening LIOPa in the vertical direction, and the upper equal potential bridge UGBa may overlap the lower equal potential bridge LGBa in the vertical direction.

Each of the first differential signal wiring line DSL1 and the second differential signal wiring line DSL2 may have a first lateral width DW. For example, the first lateral width DW may be in a range of about 5 μm to about 20 μm. Each of the upper equal potential bridge UGBa and the lower equal potential bridge LGBa may have a second lateral width GWa. For example, the second lateral width GWa may be in a range of about 5 μm to about 15 μm.

The first differential signal wiring line DSL1, the second differential signal wiring line DSL2, the single signal wiring line SSL, and the surrounding equal potential plate SGP may have substantially the same thickness, for example, a first thickness TS. The upper equal potential bridge UGBa and the upper equal potential plate UGPa may have substantially the same thickness, for example, a second thickness TU. The lower equal potential bridge UGBa and the lower equal potential plate LGPa may have substantially the same thickness, for example, a third thickness TL. In example embodiments, the second thickness TU may be greater than each of the first thickness TS and the third thickness TL. In example embodiments, the first thickness TS may be substantially equal to the third thickness TL. In example embodiments, the second thickness TU may be about 10 μm or more, and each of the first thickness TS and the third thickness TL may be less than about 10 μm. For example, each of the first thickness TS and the third thickness TL may be in a range of about 2 μm to about 9 μm, and the second thickness TU may be in a range of about 10 μm to about 30 μm.

The first differential signal wiring line DSL1 and the second differential signal wiring line DSL2, which are included in the pair of differential signal wiring lines DSL, may extend parallel to each other while maintaining substantially the same distance, for example, a first distance DS, therebetween. For example, the first distance DS may be in a range of about 5 μm to about 15 μm. In example embodiments, the first distance DS may be substantially equal to the second lateral width GWa. For example, each of the upper equal potential bridge UGBa and the lower equal potential bridge LGBa may overlap the space between the first differential signal wiring line DSL1 and the second differential signal wiring line DSL2, which are included in the pair of differential signal wiring lines DSL, in the vertical direction.

The pair of differential signal wiring lines DSL may be a second distance DG apart from the surrounding equal potential plate SGP. For example, the second distance DG may be in a range of about 10 μm to about 30 μm. The upper equal potential bridge UGBa and the lower equal potential bridge LGBa may be a third distance GGa apart from the upper equal potential plate UGPa and the lower equal potential plate LGPa, respectively. For example, the third distance GGa may be in a range of about 30 μm to about 200 μm. In example embodiments, the third distance GGa may be greater than the sum of the first lateral width DW and the second distance DG.

In example embodiments, a lateral width of the differential signal opening DOPa in a direction perpendicular to a direction in which the pair of differential signal wiring lines DSL extend may be less than each of a lateral width of the upper impedance opening UIOPa in a direction in which the upper equal potential bridge UGBa extends and a lateral width of the lower impedance opening LIOPa in the direction in which the lower equal potential bridge LGBa extends. The lateral width of the differential signal opening DOPa in the direction perpendicular to the direction in which the pair of differential signal wiring lines DSL extend may be the sum of twice the first lateral width DW, the first distance DS, and twice the second distance DG. Each of the lateral width of the upper impedance opening UIOPa in the direction in which the upper equal potential bridge UGBa extends and the lateral width of the lower impedance opening LIOPa in the direction in which the lower equal potential bridge LGBa extends may be the sum of the second lateral width GWa and twice the third distance GGa. For example, the differential signal opening DOPa may overlap the upper impedance opening UIOPa and the lower impedance opening LIOPa in the vertical direction.

The semiconductor package 1a may further include a wiring insulating layer DL. The wiring insulating layer DL may be provided adjacent to and surround the pair of differential signal wiring lines DSL to fill the differential signal opening DOPa, surround the upper equal potential bridge UGBa and the lower equal potential bridge LGBa to fill each of the upper impedance opening UIOPa and the lower impedance opening LIOPa, and fill spaces among the upper wiring layer UGLa, the signal wiring layer SLL, and the lower wiring layer LGLa.

The wiring insulating layer DL may be formed using, for example, a material film including an organic compound. In example embodiments, the wiring insulating layer DL may be formed using a material film including an organic polymer material. For example, the wiring insulating layer DL may be formed using photo-imageable dielectric (PID), an Ajinomoto build-up film (ABF), or photosensitive polyimide (PSPI). In example other embodiments, the wiring insulating layer DL may include at least one material selected from a phenol resin, an epoxy resin, and polyimide. The wiring insulating layer DL may include, for example, at least one material selected from Frame Retardant 4 (FR-4), tetrafunctional epoxy, polyphenylene ether, epoxy/polyphenylene oxide, bismaleimide triazine (BT), Thermount, cyanate ester, polyimide, and a liquid crystal polymer.

The wiring insulating layer DL may include a portion that fills the differential signal opening DOPa and surrounds the pair of differential signal wiring lines DSL, a portion that fills the upper impedance opening UIOPa and surrounds the upper equal potential bridge UGBa, a portion that fills the lower impedance opening LIOPa and surrounds the lower equal potential bridge LGBa, a portion that fills a space between the upper wiring layer UGLa and the signal wiring layer SLL, and a portion that fills a space between the signal wiring layer SLL and the lower wiring layer LGLa, and some of the portions of the wiring insulating layer DL may include a different material from the other portions thereof. For example, the portion that fills the upper impedance opening UIOPa and surrounds the upper equal potential bridge UGBa may be a portion of a PCB including at least one material selected from a phenol resin, an epoxy resin, and polyimide. In addition, the portion that fills the differential signal opening DOPa and surrounds the pair of differential signal wiring lines DSL, the portion that fills the lower impedance opening LIOPa and surrounds the lower equal potential bridge LGBa, the portion that fills the space between the upper wiring layer UGLa and the signal wiring layer SLL, and the portion that fills the space between the signal wiring layer SLL and the lower wiring layer LGLa may be a portion of a redistribution layer formed from a material film including an organic polymer material.

In the semiconductor package 1a according to example embodiments, the upper equal potential plate UGPa and the lower equal potential plate LGPa may have the upper impedance opening UIOPa and the lower impedance opening LIOPa, respectively, and the upper impedance opening UIOPa and the lower impedance opening LIOPa may be respectively above and under the pair of differential signal wiring lines DSL. Accordingly, impedances of the pair of differential signal wiring lines DSL between the upper equal potential plate UGPa and the lower equal potential plate LGPa may be controlled by the upper impedance opening UIOPa and the lower impedance opening LIOPa. Therefore, target impedances of the pair of differential signal wiring lines DSL may be satisfied, and thus, the signal intensity (SI) of the semiconductor package 1a may be improved.

Figure 2B:
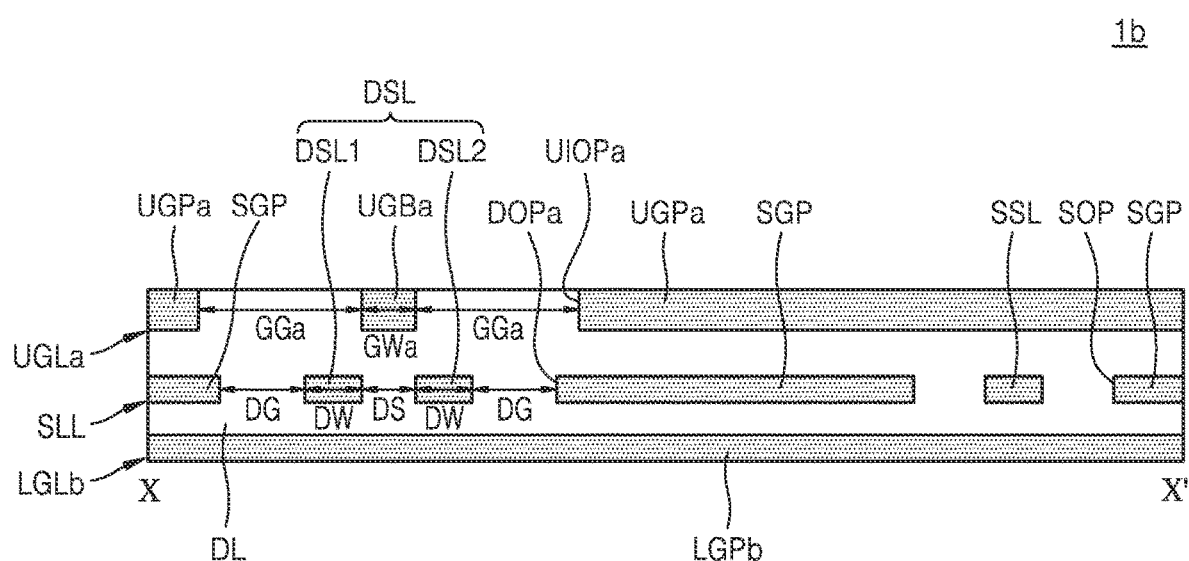

Referring to FIG. 2B, the semiconductor package 1b may include a signal wiring layer SLL and an upper wiring layer UGLa and a lower wiring layer LGLb, which are respectively above and under the signal wiring layer SLL. A pair of differential signal wiring lines DSL, a single signal wiring line SSL, and a surrounding equal potential plate SGP may be included in the signal wiring layer SLL. An upper equal potential plate UGPa and an upper equal potential bridge UGBa may be in the upper wiring layer UGLa, and a lower equal potential plate LGPb may be in the lower wiring layer LGLb.

The semiconductor package 1b may include the lower equal potential plate LGPb included in the lower wiring layer LGLb instead of the lower equal potential plate LGPa and the lower equal potential bridge LGBa, which are included in lower wiring layer LGLa included in the semiconductor package 1a of FIG. 2A. The lower equal potential plate LGPb may not include the lower impedance opening LIOPa, which is in the lower equal potential plate LGPa shown in FIG. 2A. A differential signal opening DOPa and a first differential signal wiring line DSL1 and a second differential signal wiring line DSL2, which are included in the pair of differential signal wiring lines DSL inside the differential signal opening DOPa, may overlap the lower equal potential plate LGPb in a vertical direction.

In the semiconductor package 1b according to example embodiments, the upper equal potential plate UGPa may have an upper impedance opening UIOPa, and the upper impedance opening UIOPa may be above the pair of differential signal wiring lines DSL. Accordingly, the impedances of the pair of differential signal wiring lines DSL between the upper equal potential plate UGPa and the lower equal potential plate LGPb may be controlled by the upper impedance opening UIOPa. Therefore, the target impedances of the pair of differential signal wiring lines DSL may be satisfied, and thus, the SI of the semiconductor package 1b may be improved.

Figure 2C:
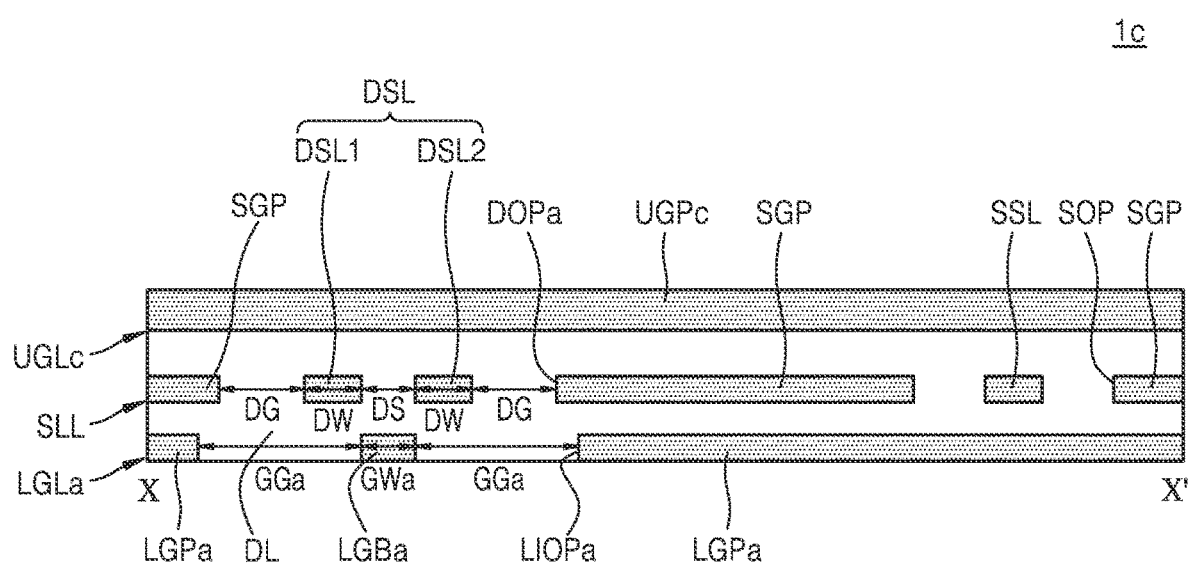

Referring to FIG. 2C, the semiconductor package 1c may include a signal wiring layer SLL and an upper wiring layer UGLc and a lower wiring layer LGLa, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPc may be in the upper wiring layer UGLc, and a lower equal potential plate LGPa and a lower equal potential bridge LGBa may be in the lower wiring layer LGLa.

The semiconductor package 1c may include the upper equal potential plate UGPc of the upper wiring layer UGLc instead of the upper equal potential plate UGPa of the upper wiring layer UGLa and the upper equal potential bridge UGBa, which are in the semiconductor package 1a shown in FIG. 2A. The upper equal potential plate UGPc may not have the upper impedance opening UIOPa, which are in the upper equal potential plate UGPa shown in FIG. 2A. A differential signal opening DOPa and a first differential signal wiring line DSL1 and a second differential signal wiring line DSL2, which are included in the pair of differential signal wiring lines DSL inside the differential signal opening DOPa, may overlap the upper equal potential plate UGPc in a vertical direction.

In the semiconductor package 1c according to example embodiments, the lower equal potential plate LGPa may have a lower impedance opening LIOPa, and the lower impedance opening LIOPa may be under the pair of differential signal wiring lines DSL. Accordingly, the impedances of the pair of differential signal wiring lines DSL between the upper equal potential plate UGPc and the lower equal potential plate LGPa may be controlled by the lower impedance opening LIOPa. Therefore, the target impedances of the pair of differential signal wiring lines DSL may be satisfied, and thus, the SI of the semiconductor package 1c may be improved.

Figure 2D:
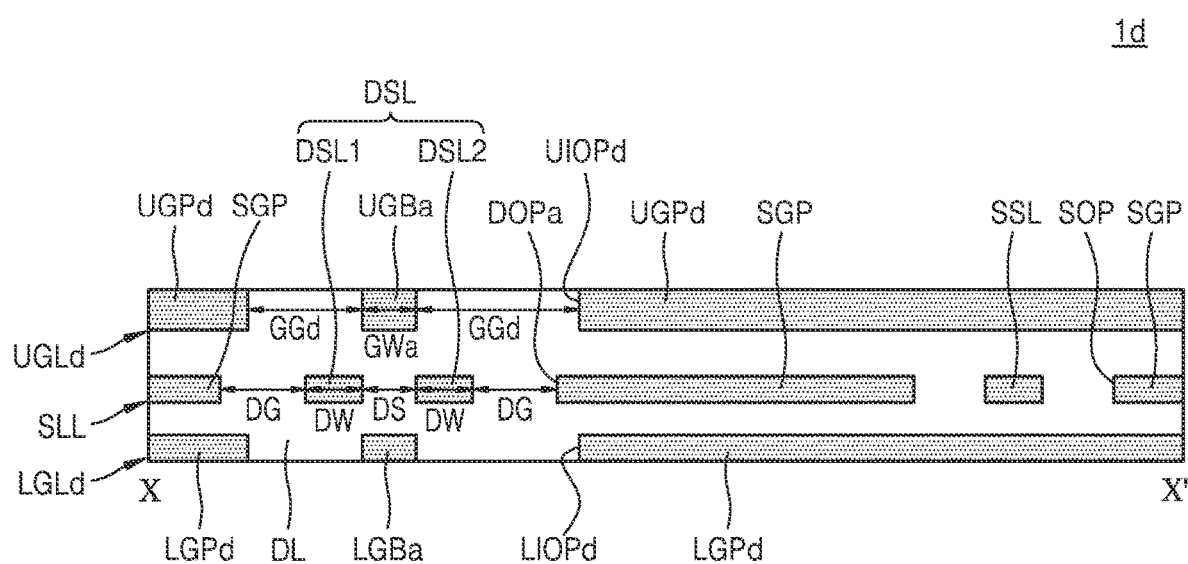

Referring to FIG. 2D, the semiconductor package 1d may include a signal wiring layer SLL and an upper wiring layer UGLd and a lower wiring layer LGLd, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPd and an upper equal potential bridge UGBa may be in the upper wiring layer UGLd, and a lower equal potential plate LGPd and a lower equal potential bridge LGBa may be in the lower wiring layer LGLd.

The upper equal potential plate UGPd and the lower equal potential plate LGPd may respectively have an upper impedance opening UIOPd and a lower impedance opening LIOPd, which correspond to a differential signal opening DOPa. At least a portion of each of the upper impedance opening UIOPd and the lower impedance opening LIOPd may overlap the differential signal opening DOPa in a vertical direction. In example embodiments, the upper impedance opening UIOPd and the lower impedance opening LIOPd may overlap each other in the vertical direction inside the differential signal opening DOPa. A first differential signal wiring line DSL1 and a second differential signal wiring line DSL2, which are included in the pair of differential signal wiring lines DSL, may overlap the upper impedance opening UIOPd and the lower impedance opening LIOPd in the vertical direction.

The upper equal potential bridge UGBa may be in the upper wiring layer UGLd and extend to bisect the upper impedance opening UIOPd. The lower equal potential bridge LGBa may be included in the lower wiring layer LPGd and extend to bisect the lower impedance opening LIOPd. Planar shapes of the upper impedance opening UIOPd and the upper equal potential bridge UGBa may be substantially the same as those of the lower impedance opening LIOPd and the lower equal potential bridge LGBa. For example, the upper impedance opening UIOPa may overlap the lower impedance opening LIOPa in the vertical direction, and the upper equal potential bridge UGBa may overlap the lower equal potential bridge LGBa in the vertical direction.

The upper equal potential bridge UGBa and the lower equal potential bridge LGBa may be a third distance GGd apart from the upper equal potential plate UGPd and the lower equal potential plate LGPd, respectively. For example, the third distance GGa may be in a range of about 30 µm to about 200 µm. In example embodiments, the third distance GGa may be greater than the sum of a first lateral width DW and a second distance DG.

In example embodiments, a lateral width of the differential signal opening DOPa in a direction perpendicular to a direction in which the pair of differential signal wiring lines DSL extend may be greater than each of a lateral width of the upper impedance opening UIOPd in a direction in which the upper equal potential bridge UGBa extends and a lateral width of the lower impedance opening LIOPd in a direction in which the lower equal potential bridge LGBa extends. For example, the upper impedance opening UIOPd and the lower impedance opening LIOPd may overlap each other inside the differential signal opening DOPa in the vertical direction.

Figure 2E:
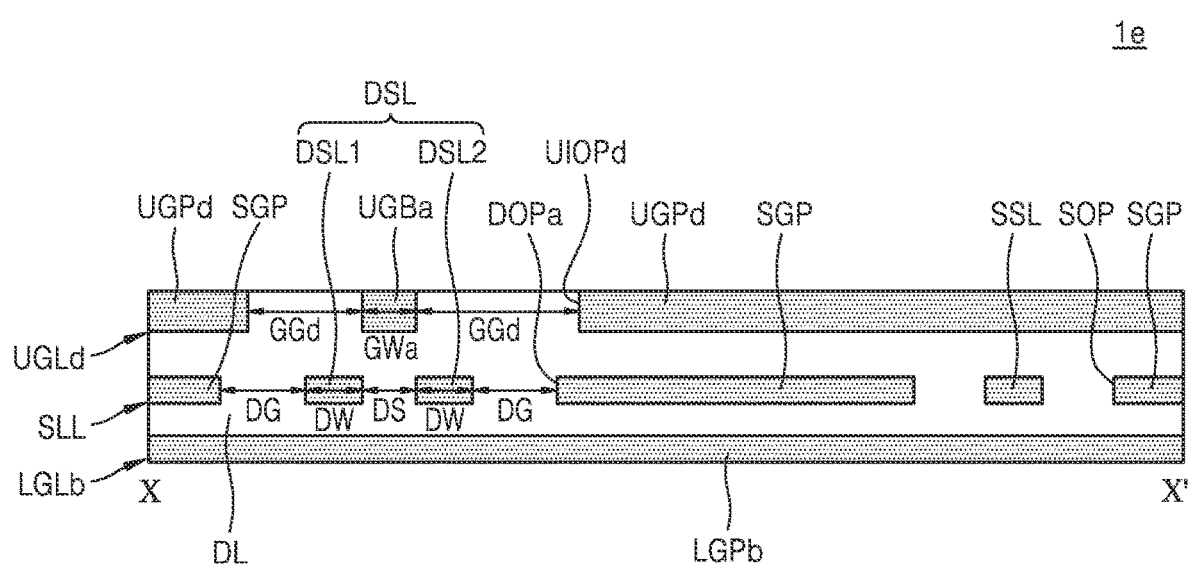

Referring to FIG. 2E, the semiconductor package 1e may include a signal wiring layer SLL and an upper wiring layer UGLd and a lower wiring layer LGLb, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPd and an upper equal potential bridge UGBa may be in the upper wiring layer UGLd, and a lower equal potential plate LGPb may be in the lower wiring layer LGLb.

The semiconductor package 1b may include the lower equal potential plate LGPb included in the lower wiring layer LGLb instead of the lower equal potential plate LGPd and the lower equal potential bridge LGBa, which are included in the lower wiring layer LGLd included in the semiconductor package 1a of FIG. 2D. The lower equal potential plate LGPb may not include the lower impedance opening LIOPd having the lower equal potential plate LGPd shown in FIG. 2D. A differential signal opening DOPa and a first differential signal wiring line DSL1 and a second differential signal wiring line DSL2, which are included in the pair of differential signal wiring lines DSL inside the differential signal opening DOPa, may overlap the lower equal potential plate LGPb in a vertical direction.

Figure 2F:
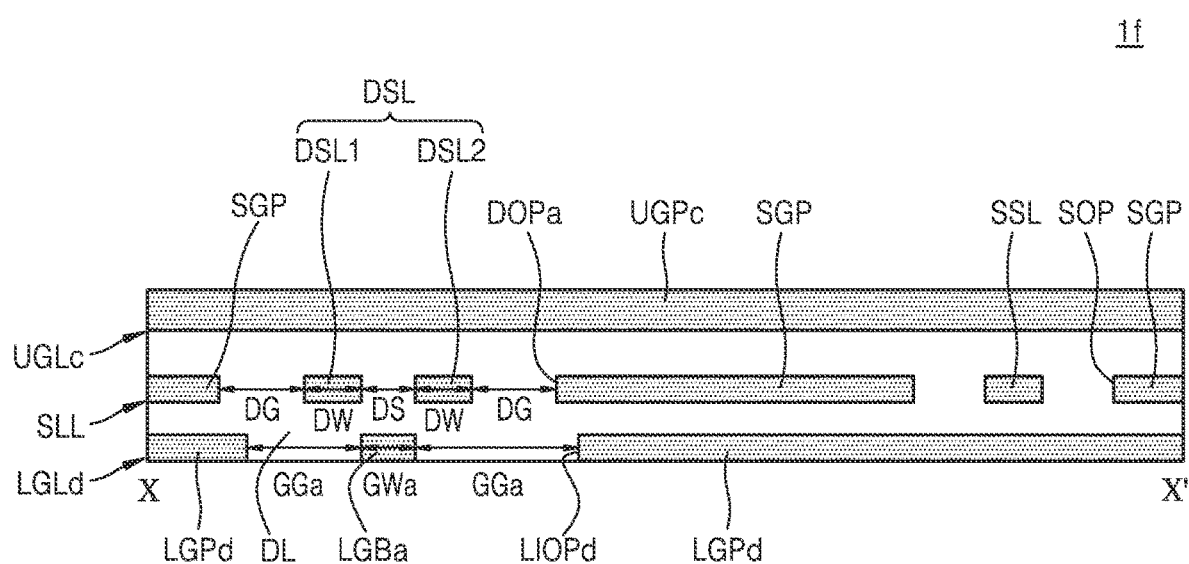

Referring to FIG. 2F, the semiconductor package 1f may include a signal wiring layer SLL and an upper wiring layer UGLc and a lower wiring layer LGLd, which are respectively above and under the signal wiring layer SLL A pair of differential signal wiring lines DSL, a single signal wiring line SSL, and a surrounding equal potential plate SGP may be in the signal wiring layer SLL. An upper equal potential plate UGPc may be in the upper wiring layer UGLc, and a lower equal potential plate LGPd and a lower equal potential bridge LGBa may be in the lower wiring layer LGLd.

The semiconductor package 1f may include the upper equal potential plate UGPc included in the upper wiring layer UGLc instead of the upper equal potential plate UGPd and the upper equal potential bridge UGBa, which are included in the upper wiring layer UGLd of the semiconductor package 1d shown in FIG. 2E. The upper equal potential plate UGPc may not include the upper impedance opening UIOPd having the upper equal potential plate UGPd shown in FIG. 2D. A differential signal opening DOPa and a first differential signal wiring line DSL1 and a second differential signal wiring line DSL2, which are in the pair of differential signal wiring lines DSL inside the differential signal opening DOPa, may overlap the upper equal potential plate UGPc in a vertical direction.

Figure 2G:
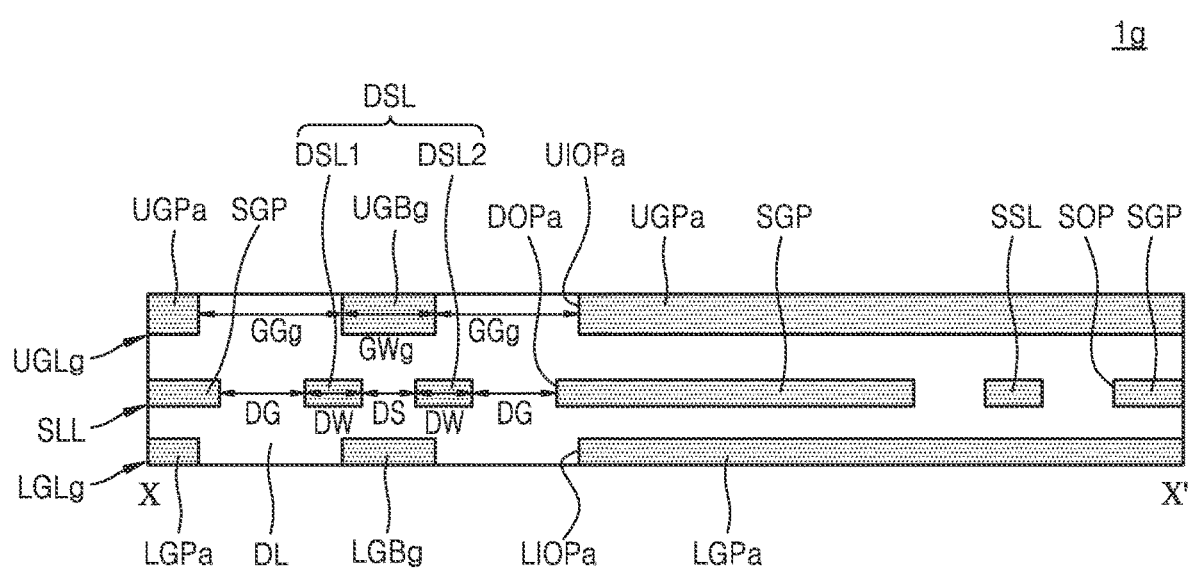

Referring to FIG. 2G, the semiconductor package 1g may include a signal wiring layer SLL and an upper wiring layer UGLg and a lower wiring layer LGLg, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPa and an upper equal potential bridge UGBg may be in the upper wiring layer UGLg, and a lower equal potential plate LGPa and a lower equal potential bridge LGBg may be in the lower wiring layer LGLg.

The upper equal potential plate UGPa and the lower equal potential plate LGPa may respectively have an upper impedance opening UIOPa and a lower impedance opening LIOPa, which correspond to a differential signal opening DOPa.

The upper equal potential bridge UGBg may be in the upper wiring layer UGLg and extend to bisect the upper impedance opening UIOPa, and the lower equal potential bridge LGBg may be in the lower wiring layer LGLg and extend to bisect the lower impedance opening LIOPa. A portion of each of the upper equal potential bridge UGBg and the lower equal potential bridge LGBg may overlap a space between the first differential signal wiring line DSL1 and the second differential signal wiring line DSL2 included in the pair of differential signal wiring lines DSL in a vertical direction.

Each of the upper equal potential bridge UGBg and the lower equal potential bridge LGBg may have a second lateral width GWg. For example, the second lateral width GWg may be in a range of about 6 µm to about 19 µm. In example embodiments, a first distance DS may be less than the second lateral width GWg. For example, the portion of each of the upper equal potential bridge UGBg and the lower equal potential bridge LGBg may overlap the space between the first differential signal wiring line DSL1 and the second differential signal wiring line DSL2, which are included in the pair of differential signal wiring lines DSL, in the vertical direction. A remaining portion of each of the upper equal potential bridge UGBg and the lower equal potential bridge LGBg may overlap a portion of each of the first differential signal wiring line DSL1 and the second differential signal wiring line DSL2 in the vertical direction.

The upper equal potential bridge UGBg and the lower equal potential bridge LGBg may be a third distance GGg apart from the upper equal potential plate UGPa and the lower equal potential plate LGPa, respectively. For example, the third distance GGg may be in a range of about 30 µm to about 200 μm. In example embodiments, the third distance GGg may be greater than the sum of a first lateral width DW and a second distance DG.

Figure 2H:
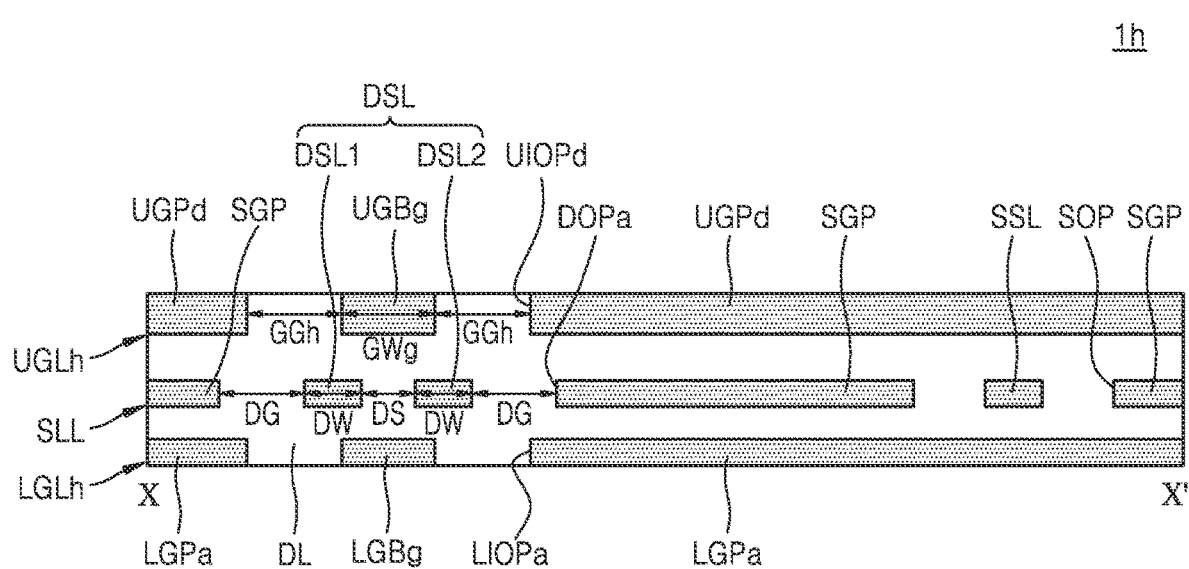

Referring to FIG. 2H, a semiconductor package 1h may be a signal wiring layer SLL and an upper wiring layer UGLh and a lower wiring layer LGLh, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPd and an upper equal potential bridge UGBg may be in the upper wiring layer UGLh, and a lower equal potential plate LGPd and a lower equal potential bridge LGBg may be in the lower wiring layer LGLh.

In the semiconductor package 1h, the upper equal potential plate UGPd shown in FIG. 2D and the upper equal potential bridge UGBg shown in FIG. 2G may be in the upper wiring layer UGLh, and the lower equal potential plate LGPd shown in FIG. 2D and the lower equal potential bridge LGBg shown in FIG. 2G may be in the lower wiring layer LGLh, and thus, detailed descriptions thereof are omitted.

Figure 2I:
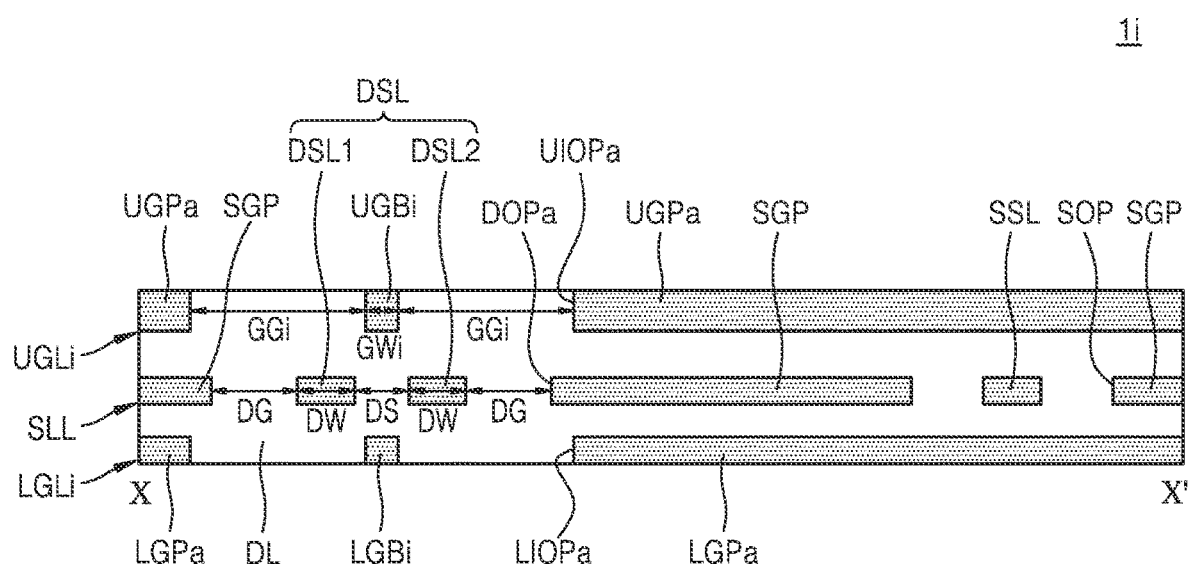

Referring to FIG. 2I, the semiconductor package 1i may include a signal wiring layer SLL and an upper wiring layer UGLi and a lower wiring layer LGLi, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPa and an upper equal potential bridge UGBi may be in the upper wiring layer UGLi, and a lower equal potential plate LGPa and a lower equal potential bridge LGBi may be in the lower wiring layer LGLi.

An upper equal potential bridge UGBi may be in the upper wiring layer UGLi and extend to bisect the upper impedance opening UIOPa. A lower equal potential bridge LGBi may be in the lower wiring layer LGLi and extend to bisect a lower impedance opening LIOPa. Each of the upper equal potential bridge UGBi and the lower equal potential bridge LGBi may overlap a portion of a space between a first differential signal wiring line DSL1 and a second differential signal wiring line DSL2, which are included in the pair of differential signal wiring lines DSL, in a vertical direction.

Each of the upper equal potential bridge UGBi and the lower equal potential bridge LGBi may have a second lateral width GWi. For example, the second lateral width GWi may be in a range of about 3 μm to about 13 μm. In example embodiments, a first distance DS may be greater than the second lateral width GWi. For example, each of the upper equal potential bridge UGBi and the lower equal potential bridge LGBi may entirely overlap the space between the first differential signal wiring line DSL1 and the second differential signal wiring line DSL2, which are included in the pair of differential signal wiring lines DSL, in the vertical direction. In a plan view from above, the upper equal potential bridge UGBi and the lower equal potential bridge LGBi may be spaced apart from the first differential signal wiring line DSL1 and the second differential signal wiring line DSL2, respectively.

The upper equal potential bridge UGBi and the lower equal potential bridge LGBi may be a third distance GGi apart from the upper equal potential plate UGPa and the lower equal potential plate LGPa, respectively. For example, the third distance GGi may be in a range of about 30 μm to about 200 μm. In example embodiments, the third distance GGi may be greater than the sum of the first lateral width DW and a second distance DG.

Figure 2J:
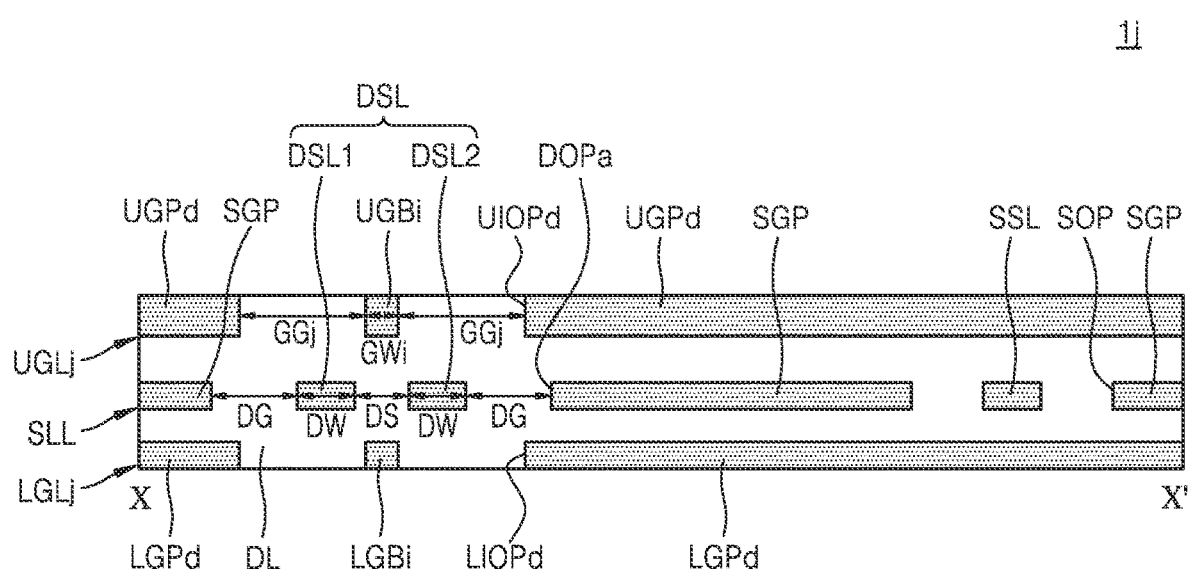

Referring to FIG. 2J, the semiconductor package 1j may include a signal wiring layer SLL and an upper wiring layer UGLj and a lower wiring layer LGLj, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPd and an upper equal potential bridge UGBi may be in the upper wiring layer UGLj, and a lower equal potential plate LGPd and a lower equal potential bridge LGBi may be in the lower wiring layer LGLj.

In the semiconductor package 1j, the upper equal potential plate UGPd shown in FIG. 2D and the upper equal potential bridge UGBi shown in FIG. 2I may be in the upper wiring layer UGLj, and the lower equal potential plate LGPd shown in FIG. 2D the lower equal potential bridge LGBi shown in FIG. 2I may be in the lower wiring layer LGLj, and thus, detailed descriptions thereof are omitted.

Figure 2K:
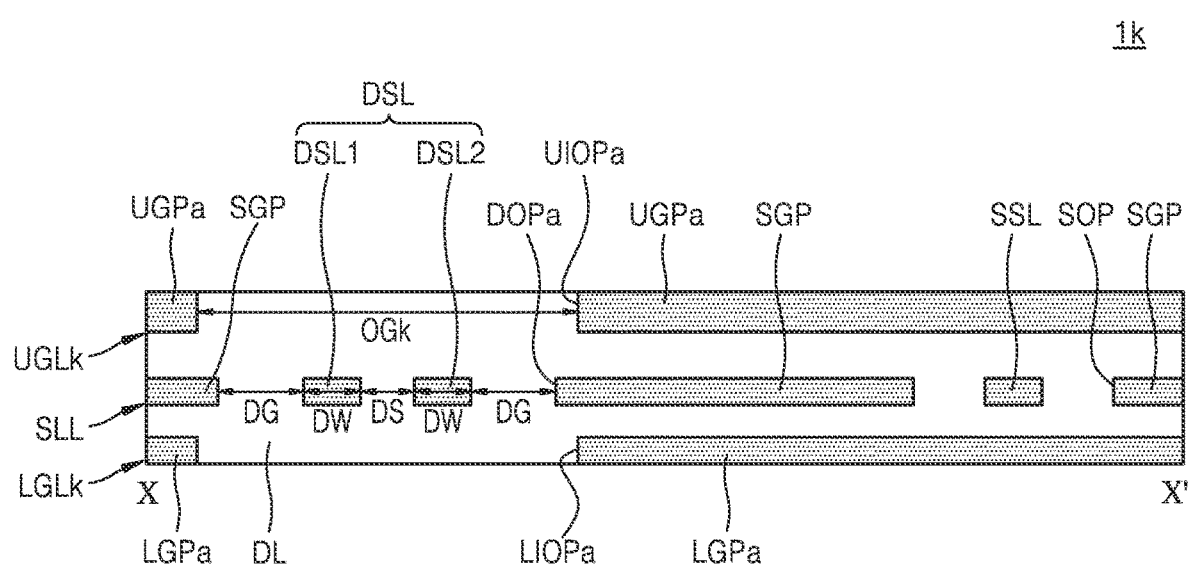

Referring to FIG. 2K, the semiconductor package 1k may include a signal wiring layer SLL and an upper wiring layer UGLk and a lower wiring layer LGLk, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPa may be in the upper wiring layer UGLk, and a lower equal potential plate LGPa may be in the lower wiring layer LGLk.

In the semiconductor package 1k, the upper equal potential plate UGPa having the upper impedance opening UIOPa shown in FIG. 2A may be in the upper wiring layer UGLk without locating the upper equal potential bridge UGBa configured to bisect the upper impedance opening UIOPa therein, and the lower equal potential plate LGPa having the lower impedance opening LIOPa shown in FIG. 2A may be in the lower wiring layer LGLk without locating the lower equal potential bridge LGBa configured to bisect the lower impedance opening LIOPa therein, and thus, detailed descriptions thereof are omitted.

A lateral width of a differential signal opening DOPa in a direction perpendicular to a direction in which the pair of differential signal wiring lines DSL extend may be less than a third width OGk, which corresponds to each of a lateral width of the upper impedance opening UIOPa and a lateral width of the lower impedance opening LIOPa. In example embodiments, the third width OGk may be the sum of the second lateral width GWa shown in FIG. 2G and twice the third distance GGa.

Figure 2L:
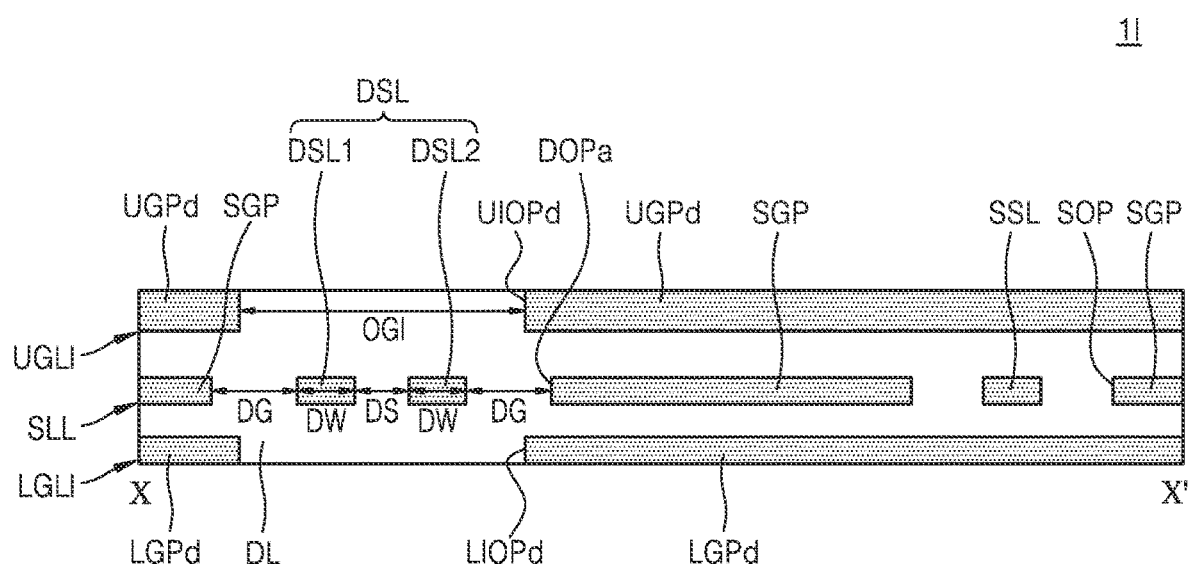

Referring to FIG. 2L, the semiconductor package 1l may include a signal wiring layer SLL and an upper wiring layer UGL1 and a lower wiring layer LGL1, which are respectively above and under the signal wiring layer SLL. A pair of differential signal wiring lines DSL, a single signal wiring line SSL, and a surrounding equal potential plate SGP may be in the signal wiring layer SLL. An upper equal potential plate UGPd may be in the upper wiring layer UGL1, and a lower equal potential plate LGPd may be in the lower wiring layer LGL1.

In the semiconductor package 1l, the upper equal potential plate UGPd having the upper impedance opening UIOPd shown in FIG. 2D may be in the upper wiring layer UGL1 without locating the upper equal potential bridge UGBd configured to bisect the upper impedance opening UIOPd therein, and the lower equal potential plate LGPd having the lower impedance opening LIOPd shown in FIG. 2D may be in the lower wiring layer LGL1 without locating the lower equal potential bridge LGBd configured to bisect the lower impedance opening LIOPd therein, and thus, detailed descriptions thereof are omitted.

A lateral width of a differential signal opening DOPa in a direction perpendicular to a direction in which the pair of differential signal wiring lines DSL extend may be greater than each of a lateral width of the upper impedance opening UIOPd and a lateral width of the lower impedance opening LIOPd.

The semiconductor packages 1g, 1h, 1i, 1j, 1k, and 1l shown in FIGS. 2G to 2L may include the lower wiring layer LGLb shown in FIG. 2B instead of including the lower wiring layer LGLg, LGLh, LGLi, LGLj, LGLk, or LGL1 or include the upper wiring layer UGLc shown in FIG. 2C instead of including the upper wiring layer UGLg, UGLh, UGLi, UGLj, UGLk, or UGL1, and thus, detailed descriptions thereof are omitted.

Figure 3:
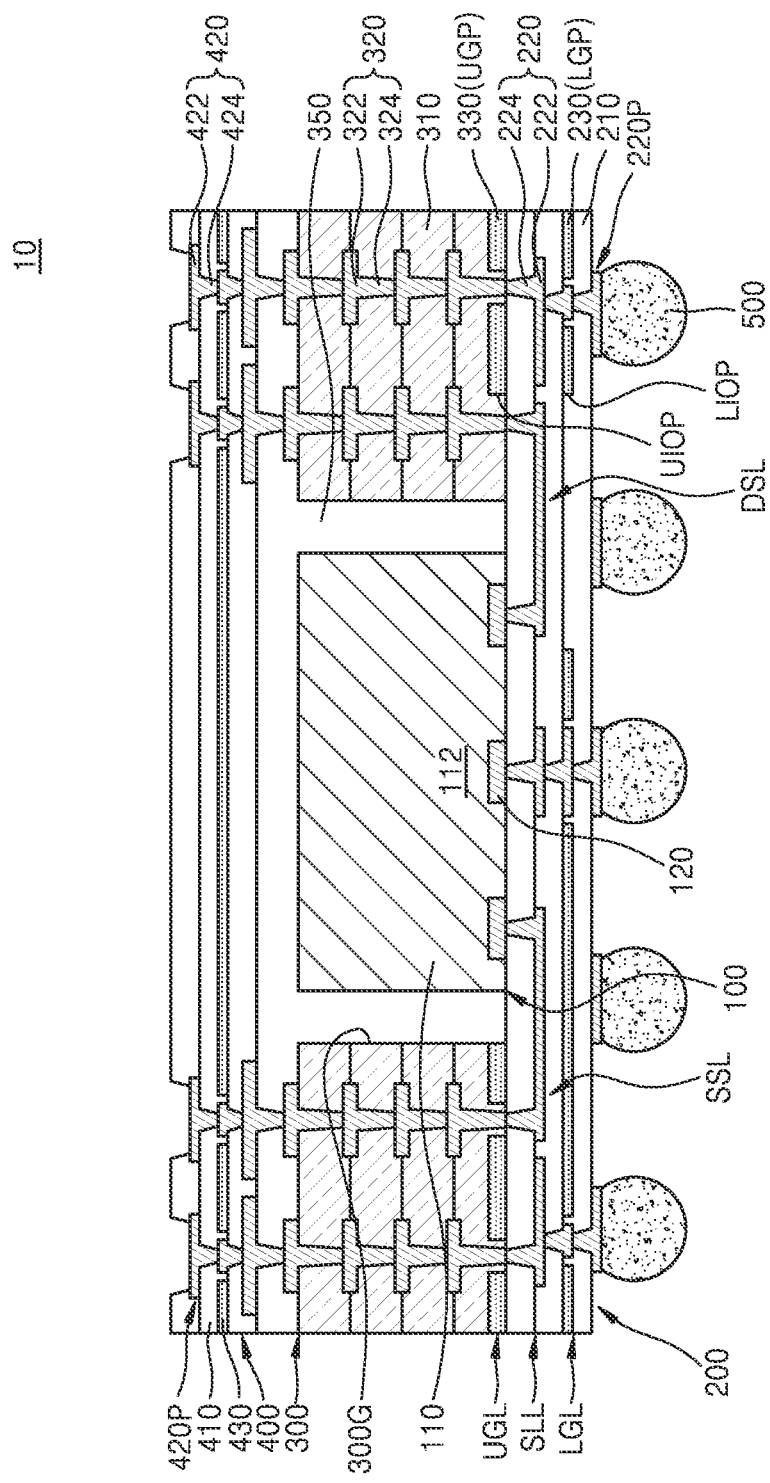
FIG. 3 is a cross-sectional view of a semiconductor package according to example embodiments.

FIG. 3 is a cross-sectional view of a semiconductor package 10 according to example embodiments.

Referring to FIG. 3, the semiconductor package 10 may include a lower redistribution layer 200, an expanded layer 300 on the lower redistribution layer 200 and having a mounting space 300G, and at least one semiconductor chip 100 inside the mounting space 300G. The expanded layer 300 may be provided adjacent to and surround the at least one semiconductor chip 100.

The semiconductor package 10 may be a fan-out semiconductor package. In example embodiments, the expanded layer 300 may be a panel board, and the semiconductor package 10 may be a fan-out panel level package (FOPLP). In example embodiments, a lateral width and a lateral area of the mounting space 300G may be greater than a lateral width and a lateral area of the semiconductor chip 100. A side surface of the semiconductor chip 100 may be spaced apart from an inner side surface of the mounting space 300G.

The semiconductor chip 100 may include a semiconductor substrate 110 having an active surface on which a semiconductor device 112 is formed and a plurality of chip connection pads 120 on the active surface of the semiconductor substrate 110. In example embodiments, when the semiconductor package 10 is a lower package of a package-on-package (PoP), the semiconductor package 10, the semiconductor chip 100, the semiconductor substrate 110, the semiconductor device 112, and the chip connection pad 120 may be referred to as a first semiconductor package, a first semiconductor chip, a first semiconductor substrate, a first semiconductor device, and a first chip connection pad, respectively.

According to example embodiments, the semiconductor substrate 110 may include a semiconductor material, such as silicon (Si). According to other example embodiments, the semiconductor substrate 110 may include a semiconductor element, such as germanium (Ge), or a compound semiconductor, such as silicon carbide (SiC), gallium arsenide (GaAs), indium arsenide (InAs), and indium phosphide (InP). The semiconductor substrate 110 may include a conductive region, for example a doped well. The semiconductor substrate 110 may have one of various device isolation structures, such as a shallow trench isolation (STI) structure.

The semiconductor device 112 including a plurality of individual devices of various types may be formed on the active surface of the semiconductor substrate 110. The plurality of individual devices may include various microelectronic devices, for example, a metal-oxide-semiconductor field effect transistor (MOSFET) (e.g., a complementary metal-insulator-semiconductor (CMOS) transistor), a system large-scale integration (LSI), an image sensor (e.g., a CMOS imaging sensor (CIS)), a micro-electro-mechanical system (MEMS), an active device, and a passive device. The plurality of individual devices may be electrically connected to the conductive region of the semiconductor substrate 110. The semiconductor device 112 may further include a conductive wiring or a conductive plug configured to electrically connect at least two of the plurality of individual devices or electrically connect the plurality of individual devices to the conductive region of the semiconductor substrate 110. In addition, each of the plurality of individual devices may be electrically isolated from other individual devices adjacent thereto by an insulating film.

The semiconductor chip 100 may include, for example, a central processing unit (CPU) chip, a graphics processing unit GPU) chip, or an application processor (AP) chip. In example embodiments, when the semiconductor package 10 includes a plurality of semiconductor chips 100, example of the plurality of semiconductor chips 100 may include, for example, a dynamic random access memory (DRAM) chips, static random access memory (SRAM) chips, flash memory chips, electrically erasable and programmable read-only memory (EEPROM) chips, phase-change random access memory (PRAM) chips, magnetic random access memory (MRAM) chips, or resistive random access memory (RRAM) chips.

The lower redistribution layer 200 may include at least one lower redistribution insulating layer 210, a lower redistribution conductive structure 220, and a lower redistribution plate 230. The at least one lower redistribution insulating layer 210 may be provided adjacent to and surround the lower redistribution conductive structure 220 and at least a portion of the lower redistribution plate 230. The lower redistribution conductive structure 220 may include a plurality of lower redistribution line patterns 222, which are on at least one of a top surface and a bottom surface of the at least one lower redistribution insulating layer 210, and a plurality of lower redistribution via patterns 224, which pass through at least some of the at least one lower redistribution insulating layer 210 and are respectively in contact with and connected to some of the plurality of lower redistribution line patterns 222. The lower redistribution plate 230 may be on at least one of the top surface and the bottom surface of the at least one lower redistribution insulating layer 210. Although FIG. 3 illustrates an example in which the plurality of lower redistribution line patterns 222 are in a different wiring layer from the lower redistribution plate 230, embodiments are not limited thereto. For example, the lower redistribution layer 200 may include a plurality of lower redistribution plates 230, at least one of the plurality of lower redistribution plates 230 may be the equal potential plate GP of FIG. 1, which is in a different wiring layer from the plurality of lower redistribution line patterns 222, and each of the remaining ones of the plurality of lower redistribution plates 230 may be the surrounding equal potential plate SGP of FIG. 1, which is in the same wiring layer as the plurality of lower redistribution line patterns 222.

Each of the lower redistribution line pattern 222, the lower redistribution via pattern 224, and the lower redistribution plate 230 may include a metal, such as copper (Cu), aluminum (Al), tungsten (W), titanium (Ti), tantalum (Ta), indium (In), molybdenum (Mo), manganese (Mn), cobalt (Co), tin (Sn), nickel (Ni), magnesium (Mg), rhenium (Re), beryllium (Be), gallium (Ga), and ruthenium (Ru), or an alloy thereof, without being limited thereto.

At least some of the plurality of lower redistribution line patterns 222 may be integrally formed with some of the plurality of lower redistribution via patterns 224. For example, some of the plurality of lower redistribution line patterns 222 may be integrally formed with some of the plurality of lower redistribution via patterns 224, which are in contact with lower portions of some of the plurality of lower redistribution line patterns 222.

In example embodiments, each of the plurality of lower redistribution via patterns 224 may have a tapered shape of which a lateral width is reduced from a lower side to an upper side thereof. For example, the lateral width of the plurality of lower redistribution via patterns 224 may increase in a direction away from the semiconductor chip 100. In example embodiments, the lateral width of the plurality of lower redistribution via patterns 224 may be reduced in a direction away from some of the plurality of lower redistribution line patterns 222, which are integrally formed with some of the plurality of lower redistribution via patterns 224.

A lower redistribution seed layer may be between the at least one lower redistribution insulating layer 210 and the lower redistribution line pattern 222, the lower redistribution via pattern 224, and the lower redistribution plate 230. For example, the lower redistribution seed layer may be formed using a physical vapor deposition (PVD) process, and the lower redistribution line pattern 222, the lower redistribution via pattern 224, and the lower redistribution plate 230 may be formed by a plating process using the lower redistribution seed layer as a seed. In example embodiments, the lower redistribution seed layer may be between the at least one lower redistribution insulating layer 210 and a top surface of each of the lower redistribution line pattern 222, the lower redistribution via pattern 224, and the lower redistribution plate 230, and between a side surface of the lower redistribution via pattern 224 and the at least one redistribution insulating layer 210. For example, the lower redistribution seed layer may be selected from copper (Cu), titanium (Ti), titanium tungsten (TiW), titanium nitride (TiN), tantalum (Ta), tantalum nitride (TaN), chromium (Cr), and aluminum (Al). However the lower redistribution seed layer is not limited to the materials described above. In example embodiments, the lower redistribution seed layer may include a copper/titanium (Cu/Ti) layer obtained by stacking copper on titanium or a copper/titanium tungsten (Cu/TiW) layer obtained by stacking copper on titanium tungsten.

In example embodiments, when the lower redistribution line pattern 222, the lower redistribution via pattern 224, and the lower redistribution plate 230 include copper (Cu), at least a portion of the lower redistribution seed layer may be used as a diffusion barrier layer.

The at least one lower redistribution insulating layer 210 may be formed using, for example, a material film including an organic compound. In example embodiments, the at least one lower redistribution insulating layer 210 may be formed using a material film including an organic polymer material. In example embodiments, the at least one lower redistribution insulating layer 210 may be formed using PSPI.

The chip connection pad 120 of the semiconductor chip 100 may be electrically connected to the lower redistribution conductive structure 220. In example embodiments, a portion of an uppermost one of the plurality of lower redistribution via patterns 224 may be in contact with the chip connection pad 120, without being limited thereto. In other example embodiments, a portion of an uppermost one of the plurality of lower redistribution line patterns 222 may be in contact with the chip connection pad 120. An external connection terminal 500 may be adhered to a lower side of the lower redistribution layer 200 and electrically connected to the lower redistribution conductive structure 220. In example embodiments, at least a portion of a lowermost one of the plurality of lower redistribution line patterns 222 may be a terminal connection pad 220P to be adhered to the external connection terminal 500.

The expanded layer 300 may include, for example, a PCB, a ceramic substrate, a package-manufacturing wafer, or an interposer. In example embodiments, the expanded layer 300 may include a multilayered PCB. The mounting space 300G may be formed as an opening or a cavity in the expanded layer 300. The mounting space 300G may be formed in a partial region (e.g., a central region) of the expanded layer 300. The mounting space 300G may be recessed or opened to a predetermined depth from a top surface of the expanded layer 300. To recess or open the expanded layer 300, a dry etching process, a wet etching process, a screen print process, a drill bit process, or a laser drilling process may be used.

The expanded layer 300 may include a substrate base 310, a wiring structure 320, and a substrate equal potential plate 330. The wiring structure 320 may include a wiring pattern 322 and a conductive via 324. The wiring structure 320 and the substrate equal potential plate 330 may include copper, nickel, stainless steel, or beryllium copper.

The substrate base 310 may include at least one material selected from a phenol resin, an epoxy resin, and polyimide. The substrate base 310 may include, for example, at least one material selected from FR-4, tetrafunctional epoxy, polyphenylene ether, epoxy/polyphenylene oxide, BT, Thermount, cyanate ester, polyimide, and a liquid crystal polymer.

In example embodiments, the substrate base 310 of the expanded layer 300 may be a multilayered substrate including a plurality of layers. The expanded layer 300 may include the wiring pattern 322 among the plurality of layers included in the substrate base 310 and on at least some of top surfaces and bottom surfaces of the plurality of layers included in the substrate base 310. The substrate equal potential plate 330 may be on at least one of the top surface and the bottom surface of each of the plurality of layers included in the substrate base 310.

The expanded layer 300 may further include a plurality of conductive vias 324 configured to pass through at least portions of the substrate base 310 and the substrate equal potential plate 330 to electrically connect the wiring patterns 322 in different wiring layers. In example embodiments, the expanded layer 300 may have wiring layers in a number that is one more than the number of layers of the substrate base 310.

The semiconductor package 10 may further include a cover insulating layer 350 configured to fill a space between the semiconductor chip 100 and the expanded layer 300. In example embodiments, the cover insulating layer 350 may fill the space between the semiconductor chip 100 and the expanded layer 300 and cover top surfaces of the semiconductor chip 100 and the expanded layer 300. For example, the cover insulating layer 350 may be formed using a thermosetting resin (e.g., an epoxy resin), a thermoplastic resin (e.g., polyimide), or a thermosetting resin or thermoplastic resin containing a reinforcing agent (e.g., an inorganic filler), specifically, an ABF, FR-4, and BT. According to other example embodiments, the cover insulating layer 350 may be formed using a molding material (e.g., an epoxy molding compound) or a photosensitive material (e.g., photoimagable encapsulant (PIE)). In example embodiments, a portion of the cover insulating layer 350 may include an insulating material, such as a silicon oxide film, a silicon nitride film, or a silicon oxynitride film.

The semiconductor package 10 may further include an upper redistribution layer 400 on the cover insulating layer 350. The upper redistribution layer 400 may include at least one upper redistribution insulating layer 410, an upper redistribution conductive structure 420, and an upper redistribution plate 430. The upper redistribution conductive structure 420 may include a plurality of upper redistribution line patterns 422 on at least one of a top surface and a bottom surface of the at least one upper redistribution insulating layer 410 and a plurality of upper redistribution via patterns 424, which pass through at least a portion of the at least one upper redistribution insulating layer 410 and are respectively in contact with and connected to some of the plurality of upper redistribution line patterns 422. The upper redistribution plate 430 may be on at least one of the top surface and the bottom surface of the at least one upper redistribution insulating layer 410. The upper redistribution insulating layer 410, the upper redistribution conductive structure 420 having the plurality of upper redistribution line patterns 422 and the plurality of upper redistribution via patterns 424, and the upper redistribution plate 430, which are included in the upper redistribution layer 400, may be substantially similar to the lower redistribution insulating layer 210, the lower redistribution conductive structure 230 having the plurality of lower redistribution line patterns 222 and the plurality of lower redistribution via patterns 224, and the lower redistribution plate 230, which are included in the lower redistribution layer 200, and thus, repeated descriptions thereof are omitted.

At least some of the plurality of upper redistribution line patterns 422 may be integrally formed with some of the plurality of upper redistribution via patterns 424. For example, some of the plurality of upper redistribution line patterns 422 may be integrally formed with some of the plurality of upper redistribution via patterns 424, which are in contact with lower portions of some of the plurality of upper redistribution line patterns 422.

In example embodiments, each of the plurality of upper redistribution via patterns 424 may have a tapered shape of which a lateral width increases from a lower side to an upper side thereof. For example, the lateral width of the plurality of upper redistribution via patterns 424 may increase in a direction away from the semiconductor chip 100. In example embodiments, the lateral width of the plurality of upper redistribution via patterns 424 may be reduced in a direction away from some of the plurality of upper redistribution line patterns 422, which are integrally formed with some of the plurality of upper redistribution via patterns 424.

An uppermost one of the plurality of upper redistribution line patterns 422 may be a package connection pad 420P having a top surface of which a portion is not covered by the upper redistribution insulating layer 410 but exposed. In example embodiments, when the semiconductor package 10 is a lower package of a PoP, an upper package of the PoP may be connected to the package connection pad 420P.

In example embodiments, an uppermost one of a plurality of wiring layers included in the lower redistribution layer 200 may be a signal wiring line layer SLL, and a second uppermost one thereof may be a lower wiring layer LGL. A lowermost one of a plurality of wiring layers included in the expanded layer 300 may be an upper wiring layer UGL.

Some of the lower redistribution line patterns 222 in the signal wiring line layer SLL may be differential signal wiring lines DSL, and some others thereof may be single signal wiring lines SSL. The lower redistribution plate 230 in the lower wiring layer LGL may be a lower equal potential plate LGP having a lower impedance opening LIOP. The substrate equal potential plate 330 in the upper wiring layer UGL may be an upper equal potential plate UGP having an upper impedance opening UIOP. The lower impedance opening LIOP and the upper impedance opening UIOP may overlap the differential signal wiring line DSL in a vertical direction.

Each of the differential signal wiring line DSL and the single signal wiring line SSL may electrically connect the chip connection pad 120 of the semiconductor chip 100 to the package connection pad 420P. The chip connection pad 120 may be electrically connected to the package connection pad 420P through one of the differential signal wiring line DSL and the single signal wiring line SSL, the wiring structure 320, and the upper redistribution conductive structure 420. Each of the differential signal wiring line DSL and the single signal wiring line SSL may extend from a portion of the lower redistribution layer 200 under the semiconductor chip 100 to a portion of the lower redistribution layer 200 under the expanded layer 300. The lower impedance opening LIOP may be arranged above the portion of the lower redistribution layer 200 under the semiconductor chip 100, a portion of the lower redistribution layer 200 under the cover insulating layer 350, and the portion of the lower redistribution layer 200 under the expanded layer 300. The upper impedance opening UIOP may be only in a portion of the expanded layer 300.

The signal wiring line layer SLL, the differential signal wiring line DSL, and the single signal wiring line SSL, which are shown in FIG. 3, may respectively correspond to the signal wiring line layer SLL, the differential signal wiring line DSL, and the single signal wiring line SSL, which are shown in FIGS. 2A, 2D, 2G, 2H, 2I, 2J, 2K, and 2L.

The lower wiring layer LGL shown in FIG. 3 may correspond to one of the lower wiring layers LGLa, LGLd, LGLg, LGLh, LGLi, LGLj, LGLk, and LGL1 shown in FIGS. 2A, 2D, 2G, 2H, 2I, 2J, 2K, and 2L, the lower impedance opening LIOP may correspond to one of the lower impedance openings LIOPa and LIOPd shown in FIGS. 2A, 2D, 2G, 2H, 2I, 2J, 2K, and 2L, and the lower equal potential plate LGP may correspond to one of the lower equal potential plates LGPa, LGPb, and LGPd shown in FIGS. 2A, 2D, 2G, 2H, 2I, 2J, 2K, and 2L.

The upper wiring layer UGL shown in FIG. 3 may correspond to one of the upper wiring layers UGLa, UGLd, UGLg, UGLh, UGLi, UGLj, UGLk, and UGL1 shown in FIGS. 2A, 2D, 2G, 2H, 2I, 2J, 2K, and 2L, the upper impedance opening UIOP may correspond to one of the upper impedance openings UIOPa and UIOPd shown in FIGS. 2A, 2D, 2G, 2H, 2I, 2J, 2K, and 2L, and the upper equal potential plate UGP may correspond to one of the upper equal potential plates UGPa, UGPb, and UGPd shown in FIGS. 2A, 2D, 2G, 2H, 2I, 2J, 2K, and 2L.

The lower redistribution insulating layer 210 and the substrate base 310, which are shown in FIG. 3, may constitute the wiring insulating layer DL shown in FIGS. 2A, 2D, 2G, 2H, 2I, 2J, 2K, and 2L.

In the semiconductor package 10, the lower equal potential bridges LGBa, LGBh, and LGBi shown in FIGS. 2A, 2D, 2G, 2H, 2I, 2J, 2K, and 2L may be in the lower wiring layer LGL, and the upper equal potential bridges UGBa, UGBh, and UGBi shown in FIGS. 2A, 2D, 2G, 2H, 2I, 2J, 2K, and 2L may be in the upper wiring layer UGL.

Figure 4A:
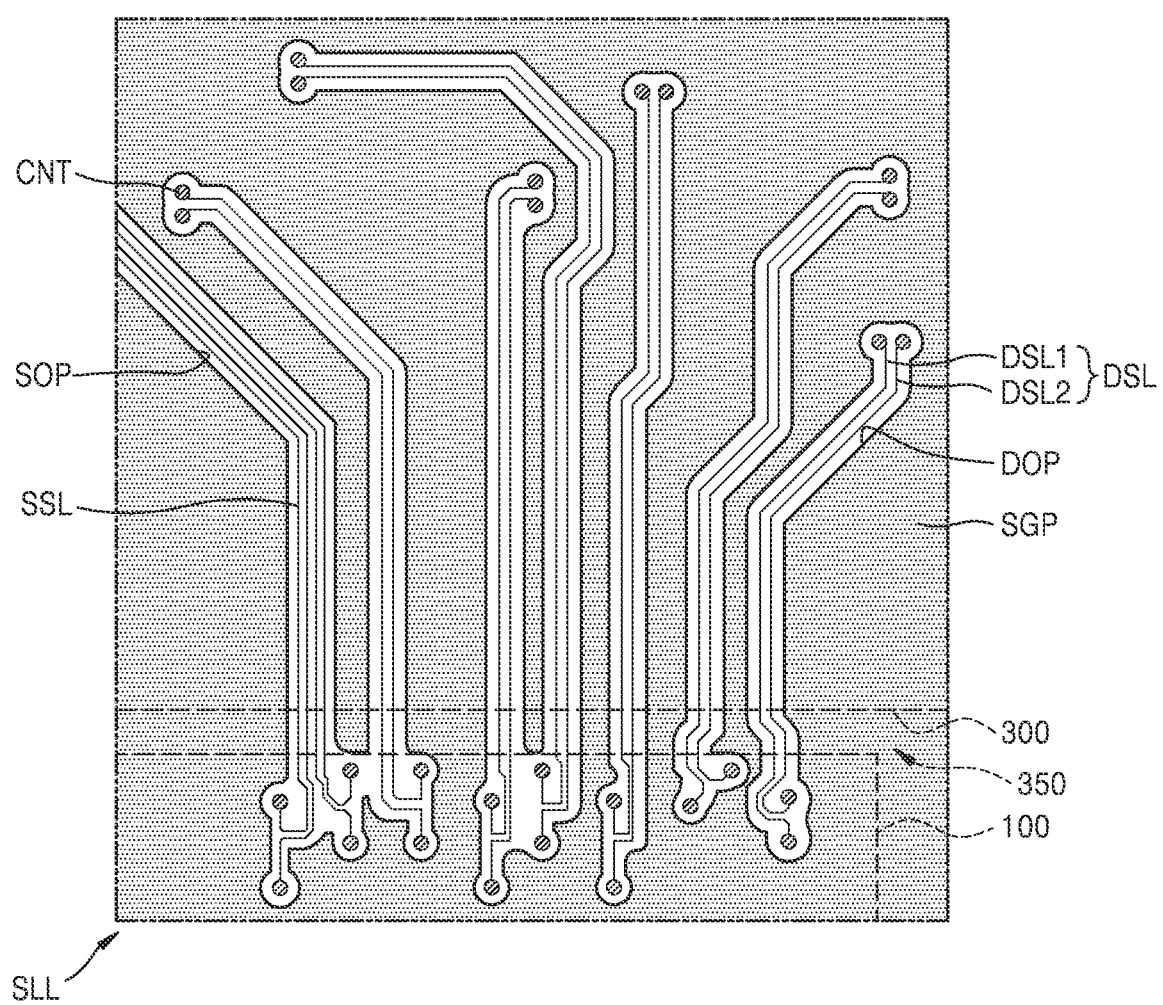
FIGS. 4A, 4B, and 4C are plan views of line patterns included in a semiconductor package according to example embodiments.
Figure 4B:
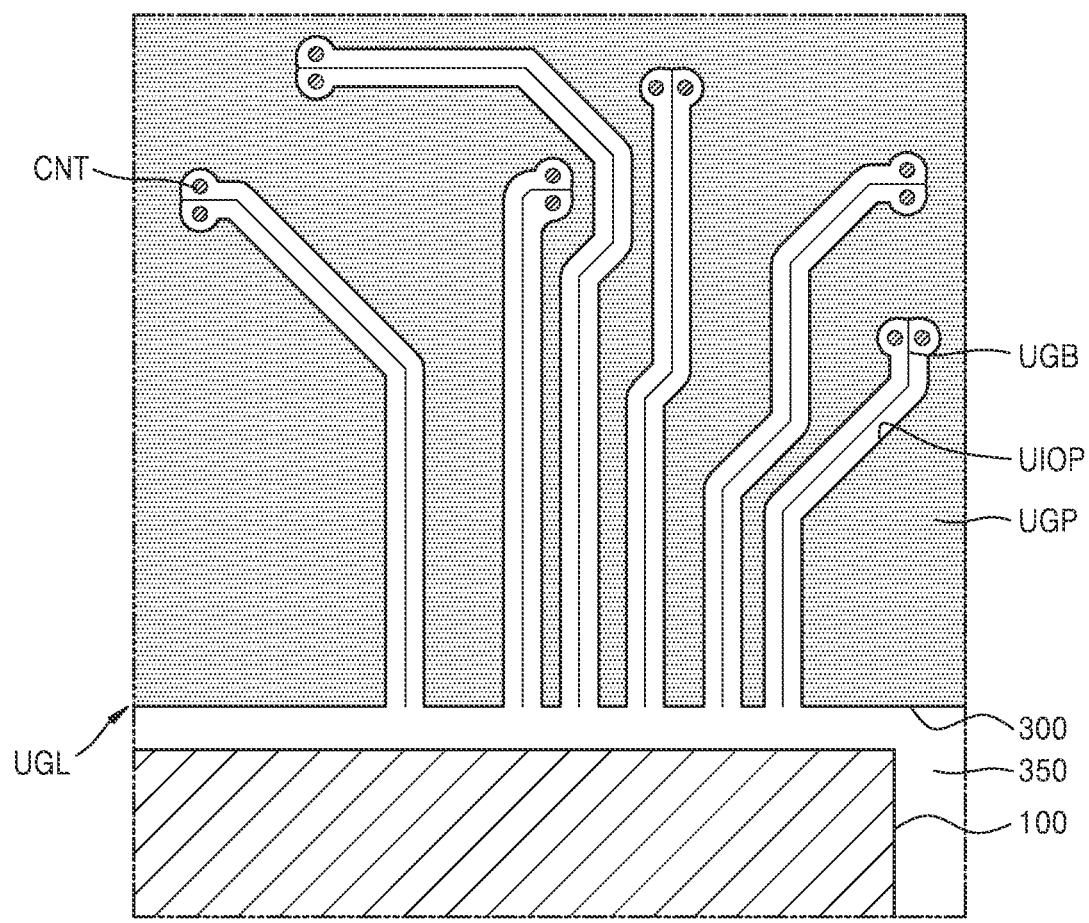
Figure 4C:
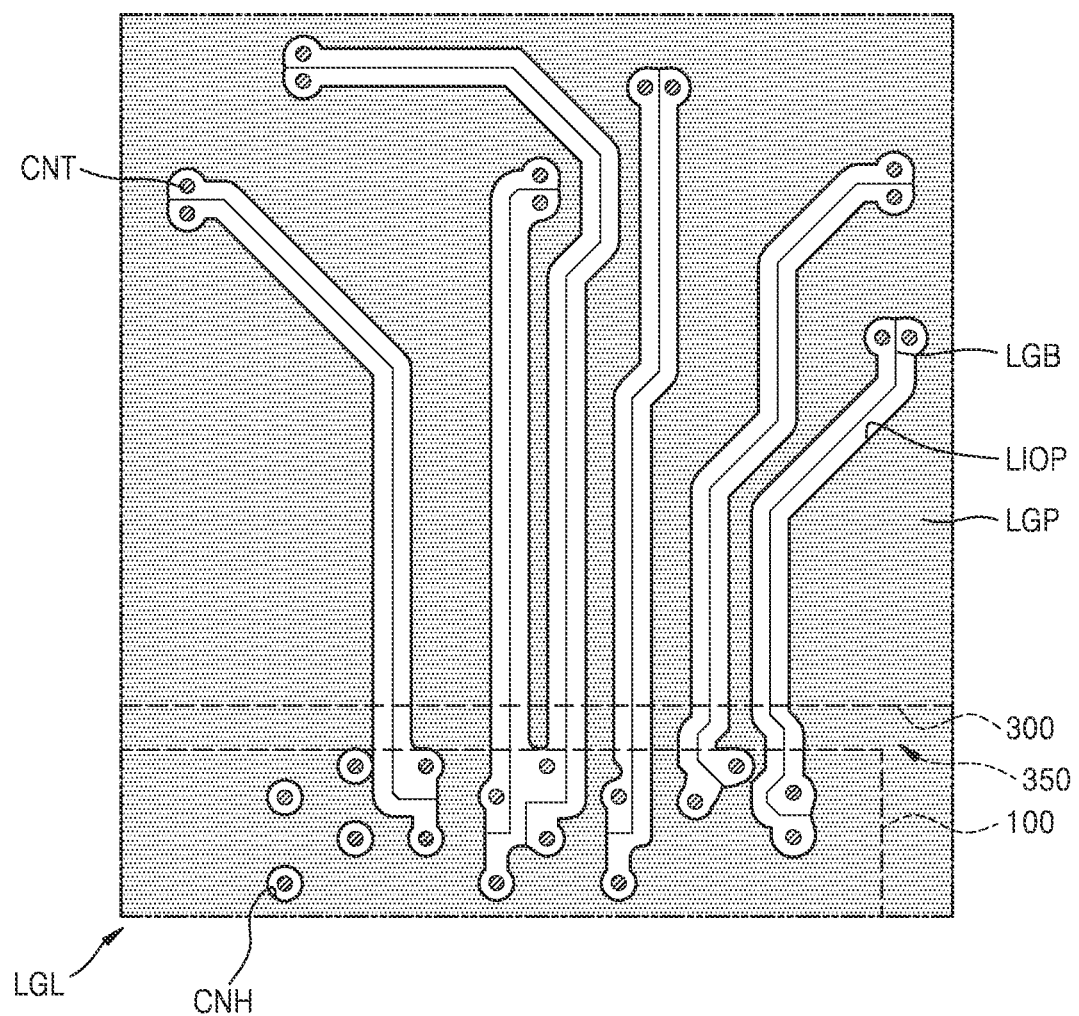

FIGS. 4A to 4C are plan views of line patterns included in a semiconductor package according to example embodiments. Specifically, FIGS. 4A to 4C are plan views of respective portions of the signal wiring line layer SLL, the upper wiring layer UGL, and the lower wiring layer LGL, which are included in the semiconductor package 10 shown in FIG. 3.

Referring to FIGS. 3 and 4A to 4C, the semiconductor package 10 may include a signal wiring line layer SLL, an upper wiring layer UGL, and a lower wiring layer LGL. The signal wiring line layer SLL, the upper wiring layer UGL, and the lower wiring layer LGL may be wiring layers located at different vertical levels. The signal wiring line layer SLL, the upper wiring layer UGL, and the lower wiring layer LGL, which are shown in FIGS. 4A to 4C, may overlap each other in a vertical direction.

A single signal wiring line SSL and a pair of differential signal wiring lines DSL and may be in the signal wiring line layer SLL. The pair of differential signal wiring lines DSL may include a first differential signal wiring line DSL1 and a second differential signal wiring line DSL2. A single signal wiring line SSL may extend apart from the pair of differential signal wiring lines DSL. In example embodiments, a surrounding equal potential plate SGP may be in the signal wiring line layer SLL. The surrounding equal potential plate SGP may be apart from each of the differential signal wiring line DSL and the single signal wiring line SSL and surround the pair of differential signal wiring lines DSL and the single signal wiring line SSL. The surrounding equal potential plate SGP may be a portion of a lower redistribution plate 230 in the signal wiring line layer SLL. The surrounding equal potential plate SGP may have a differential signal opening DOP and a single signal opening SOP. The pair of differential signal wiring lines DSL may be inside the differential signal opening DOP, and the single signal wiring line SSL may be inside the single signal opening SOP. In example embodiments, a plurality of single signal wiring lines SSL, which are apart from each other, may be inside the single signal opening SOP.

Each of the differential signal wiring line DSL, the differential signal opening DOP, the single signal wiring line SSL, and the single signal opening SOP may extend from a portion of a lower redistribution layer 200 under the semiconductor chip 100 to a portion of the lower redistribution layer 200 under an expanded layer 300 and be arranged above portions of the signal wiring line layer SLL under the semiconductor chip 100, a cover insulating layer 350, and the expanded layer 300.

Contact plugs CNT may be connected to both ends of each of the first differential signal wiring line DSL1 and the second differential signal wiring line DSL2, which are included in the pair of differential signal wiring lines DSL and the single signal wiring line SSL. The contact plug CNT may extend in the vertical direction and electrically connect wiring lines located at different vertical levels. The contact plug CNT may be apart from an upper equal potential plate UGP and/or a lower equal potential plate LGP and pass through the upper equal potential plate UGP and/or the lower equal potential plate LGP. The contact plugs CNT connected to the both ends of each of the first differential signal wiring line DSL1 and the second differential signal wiring line DSL2, which are included in the pair of differential signal wiring lines DSL, may extend in the vertical direction through an upper impedance opening UIOP and a lower impedance opening LIOP. The contact plugs CNT connected to the both ends of the single signal wiring line SSL may extend in the vertical direction through contact openings CNH of each of the upper equal potential plate UGP and the lower equal potential plate LGP.

The upper equal potential plate UGP may be in the upper wiring layer UGL, and the lower equal potential plate LGP may be in the lower wiring layer LGL. The upper equal potential plate UGP may have the upper impedance opening UIOP corresponding to the differential signal opening DOP, and the lower equal potential plate LGP may have the lower impedance opening LIOP corresponding to the differential signal opening DOP. The upper impedance opening UIOP may have a substantially similar planar shape to that of a portion of the differential signal opening DOP, which overlaps the expanded layer 300 in the vertical direction. At least a portion of the upper impedance opening UIOP may overlap the portion of the differential signal opening DOP, which overlaps the expanded layer 300 in the vertical direction. The lower impedance opening LIOP may have a substantially similar planar shape to that of the differential signal opening DOP, and at least a portion of the lower impedance opening LIOP may overlap the differential signal opening DOP in the vertical direction. The upper impedance opening UIOP may overlap a portion of each of the first differential signal wiring line DSL1 and the second differential signal wiring line DSL2, which overlaps the expanded layer 300 in the vertical direction, in the vertical direction. The lower impedance opening LIOP may overlap the first differential signal wiring line DSL1 and the second differential signal wiring line DSL2 in the vertical direction. In example embodiments, the upper impedance opening UIOP may extend to an edge of the upper equal potential plate UGP adjacent to the semiconductor chip 100, and the lower impedance opening LIOP may be in the lower equal potential plate LGP without extending to an edge of the lower equal potential plate LGP.

In example embodiments, an upper equal potential bridge UGB may be in the upper wiring layer UGL and extend to bisect the upper impedance opening UIOP. A lower equal potential bridge LGB may be in the lower wiring layer LGL and extend to bisect the lower impedance opening LIOP. The upper equal potential bridge UGB may overlap a portion of a space between the first differential signal wiring line DSL1 and the second differential signal wiring line DSL2, which may overlap the expanded layer 300 in the vertical direction, in the vertical direction. The lower equal potential bridge LGB may overlap the space between the first differential signal wiring line DSL1 and the second differential signal wiring line DSL2 in the vertical direction. The upper equal potential bridge UGB and the lower equal potential bridge LGB may be apart from the contact plug CNT. The upper equal potential plate UGP may be integrally formed with the upper equal potential bridge UGB, and the lower equal potential plate LGP may be integrally formed with the lower equal potential bridge LGB. One end of the upper equal potential bridge UGB may not be connected to the upper equal potential plate UGP but be in contact with the cover insulating layer 350, and another end thereof may be connected to a portion of the upper equal potential plate UGP. One end of the lower equal potential bridge LGB may be connected to a portion of the lower equal potential plate LGP, and another end thereof may be connected to another portion of the lower equal potential plate LGP.

In the semiconductor package 10 according to example embodiments, the upper equal potential plate UGP and the lower equal potential plate LGP may have the upper impedance opening UIOP and the lower impedance opening LIOP, respectively, and the upper impedance opening UIOP and the lower impedance opening LIOP may be respectively above and under the pair of differential signal wiring lines DSL. Accordingly, the impedances of the pair of differential signal wiring lines DSL between the upper equal potential plate UGP and the lower equal potential plate LGP may be controlled by the upper impedance opening UIOP and the lower impedance opening LIOP. Therefore, the target impedances of the pair of differential signal wiring lines DSL may be satisfied, and thus, the SI of the semiconductor package 10 may be improved.

Figure 5A:
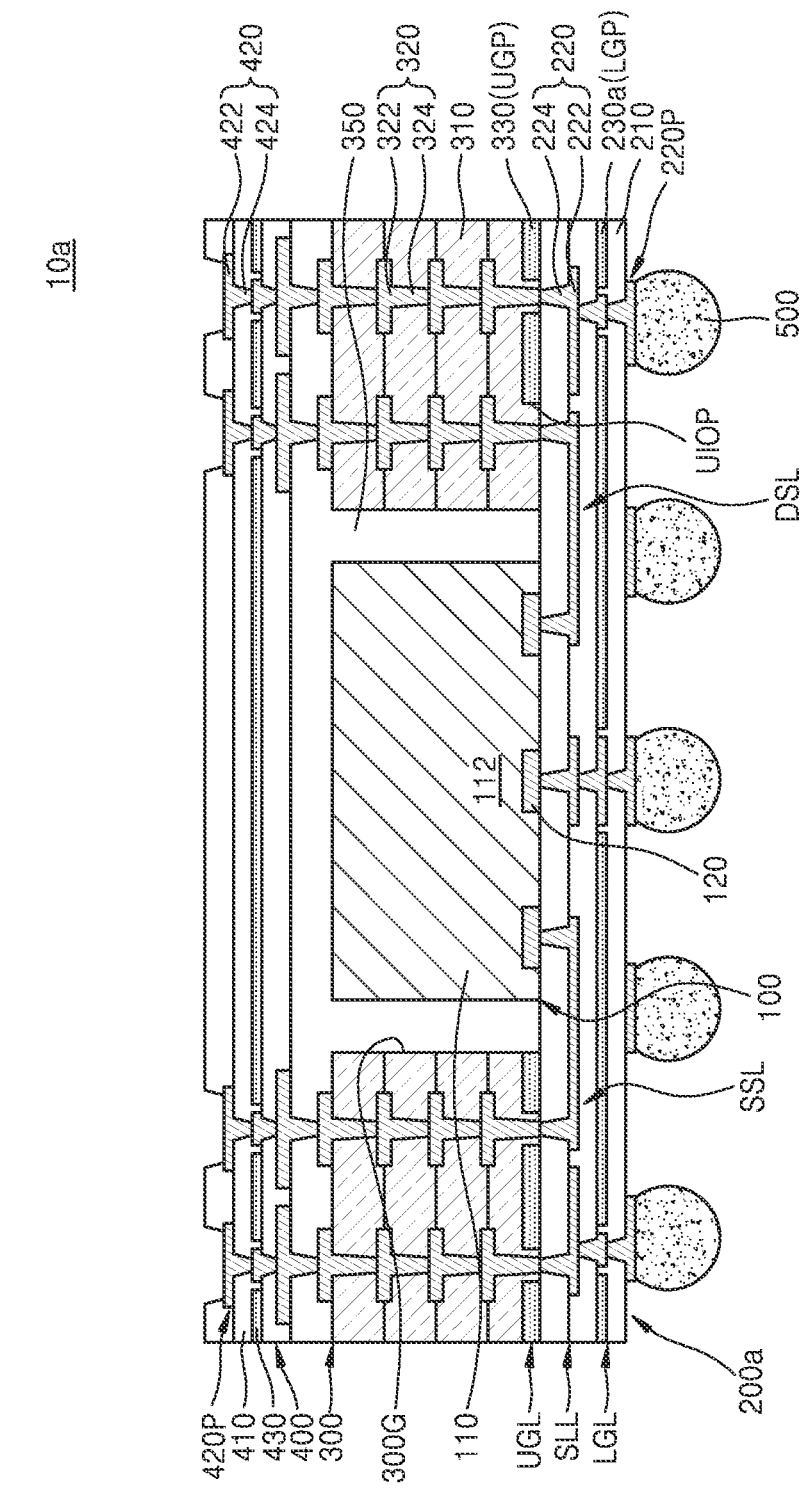

FIGS. 5A and 5B are cross-sectional views of semiconductor packages according to example embodiments. In FIGS. 5A and 5B, the same element names as in FIG. 3 denote substantially the same elements or modified elements, the same reference numerals as in FIG. 3 denote substantially the same elements, and the same descriptions as in FIG. 3 may be omitted.

Referring to FIG. 5A, a semiconductor package 10a may include a lower redistribution layer 200a, an expanded layer 300 having a mounting space 300G on the lower redistribution layer 200a, at least one semiconductor chip 100 inside the mounting space 300G, and an upper redistribution layer 400 on the expanded layer 300 and the at least one semiconductor chip 100. The lower redistribution layer 200a may include at least one lower redistribution insulating layer 210, a lower redistribution conductive structure 220, and a lower redistribution plate 230a.

In example embodiments, an uppermost one of a plurality of wiring layers included in the lower redistribution layer 200a may be a signal wiring line layer SLL, and a second uppermost one thereof may be a lower wiring layer LGL. A lowermost one of a plurality of wiring layers of the expanded layer 300 may be an upper wiring layer UGL. The lower redistribution plate 230a in the lower wiring layer LGL may be a lower equal potential plate LGP, and an equal potential plate 330 in the upper wiring layer UGL may be an upper equal potential plate UGP having an upper impedance opening UIOP. The lower equal potential plate LGP may not have the lower impedance opening LIOP shown in FIG. 3. The upper impedance opening UIOP may overlap a portion of a differential signal wiring line DSL, which overlaps the expanded layer 300 in a vertical direction, in the vertical direction.

The signal wiring line layer SLL, the differential signal wiring line DSL, and the single signal wiring line SSL, which are shown in FIG. 5A, may correspond to the signal wiring line layer SLL, the differential signal wiring line DSL, and the single signal wiring line SSL, which are shown in FIGS. 2B and 2E. The lower wiring layer LGL shown in FIG. 5A may correspond to one of the lower wiring layers LGLb and LGLe shown in FIGS. 2B and 2E, and the lower equal potential plate LGP shown in FIG. 5A may correspond to the lower equal potential plate LGPb shown in FIGS. 2B and 2E. The upper wiring layer UGL shown in FIG. 5A may correspond to one of the upper wiring layers UGLa and UGLd shown in FIGS. 2B and 2E, the upper impedance opening UIOP may correspond to one of the upper impedance openings UIOPa and UIOPd shown in FIGS. 2B and 2E, and the upper equal potential plate UGP may correspond to one of the upper equal potential plates UGPa, and UGPd shown in FIGS. 2B and 2E. Although not separately shown, in the semiconductor package 10a, the upper equal potential bridge UGBa shown in FIGS. 2B and 2E may be in the upper wiring layer UGL.

Referring to FIG. 5B, a semiconductor package 10b may include a lower redistribution layer 200, an expanded layer 300a on the lower redistribution layer 200 and having a mounting space 300G, at least one semiconductor chip 100 inside the mounting space 300G, and an upper redistribution layer 400 on the expanded layer 300a and the at least one semiconductor chip 100. The expanded layer 300a may include a substrate base 310, a wiring structure 320, and a substrate equal potential plate 330a.

In example embodiments, an uppermost one of a plurality of wiring layers included in the lower redistribution layer 200 may be a signal wiring line layer SLL, and a second uppermost one thereof may be a lower wiring layer LGL. A lowermost one of a plurality of wiring layers included in the expanded layer 300a may be an upper wiring layer UGL. A lower redistribution plate 230 in the lower wiring layer LGL may be a lower equal potential plate LGP, and the substrate equal potential plate 330a in the upper wiring layer UGL may be an upper equal potential plate UGP having an upper impedance opening UIOP. The upper equal potential plate UGP may not have the upper impedance opening UIOP shown in FIG. 3. The lower impedance opening UIOP may overlap a differential signal wiring line DSL in a vertical direction.

The signal wiring line layer SLL, the differential signal wiring line DSL, and the single signal wiring line SSL, which are shown in FIG. 5B, may correspond to the signal wiring line layer SLL, the differential signal wiring line DSL, and the single signal wiring line SSL, which are shown in FIGS. 2C and 2F. The lower wiring layer LGL shown in FIG. 5B may correspond to one of the lower wiring layer LGLc, LGLf shown in FIGS. 2C and 2F, a lower impedance opening LIOP shown in FIG. 5B may correspond to one of the lower impedance openings LIOPa and LIOPd shown in FIGS. 2C and 2F, and the lower equal potential plate LGP shown in FIG. 5B may correspond to one of the lower equal potential plates LGPa and LGPb shown in FIGS. 2C and 2F. The upper wiring layer UGL shown in FIG. 5B may correspond to the upper wiring layer UGLc shown in FIGS. 2C and 2F, and the upper equal potential plate UGP shown in FIG. 5B may correspond to one of the upper equal potential plates UGPa and UGPd shown in FIGS. 2C and 2F.

The semiconductor package 10b, the lower equal potential bridge LGBa shown in FIGS. 2C and 2F may be in the lower wiring layer LGL.

Figure 6A:
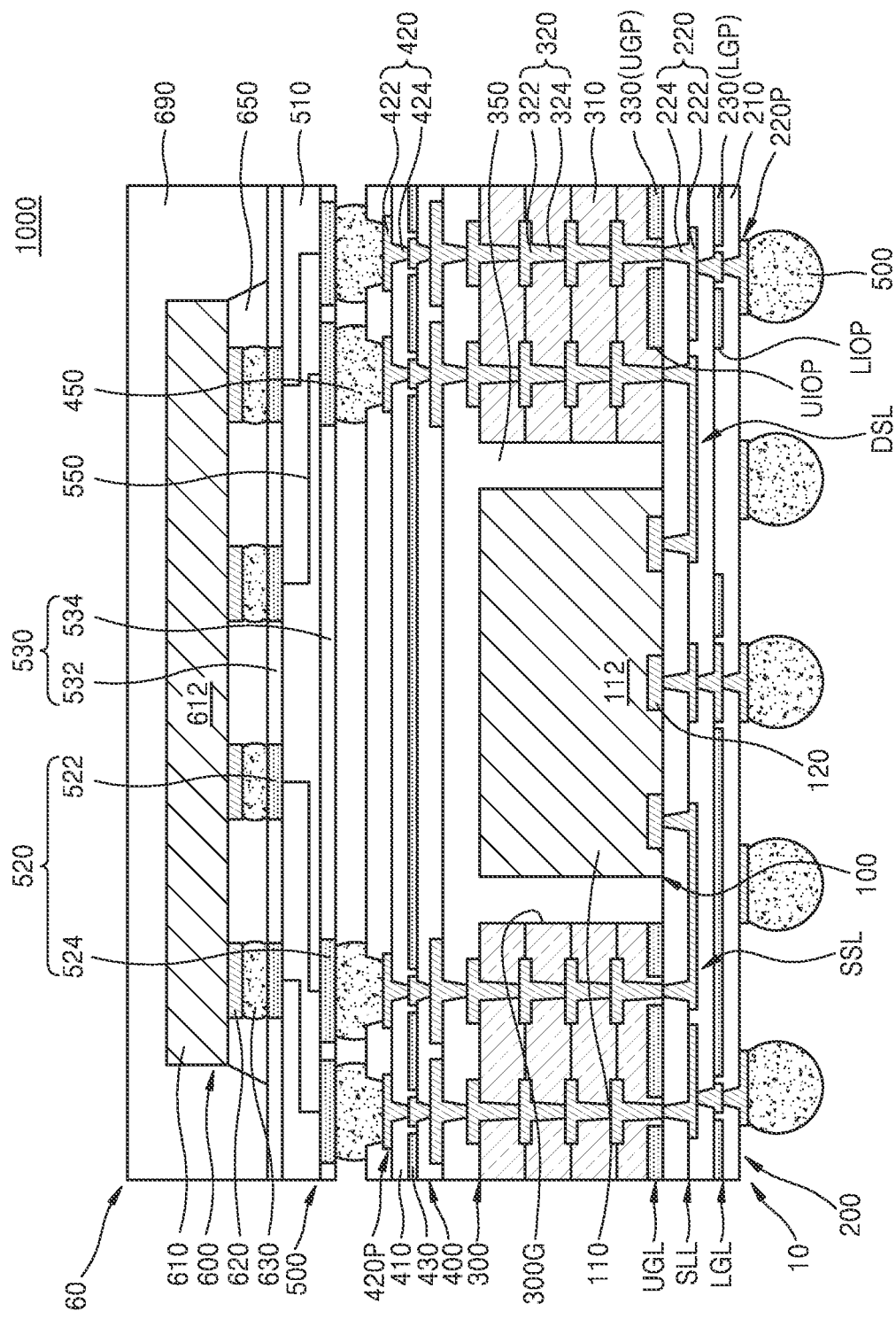
FIGS. 6A, 6B, and 6C are cross-sectional views of a package-on-package (PoP) including a semiconductor package according to embodiments.
Figure 6B:
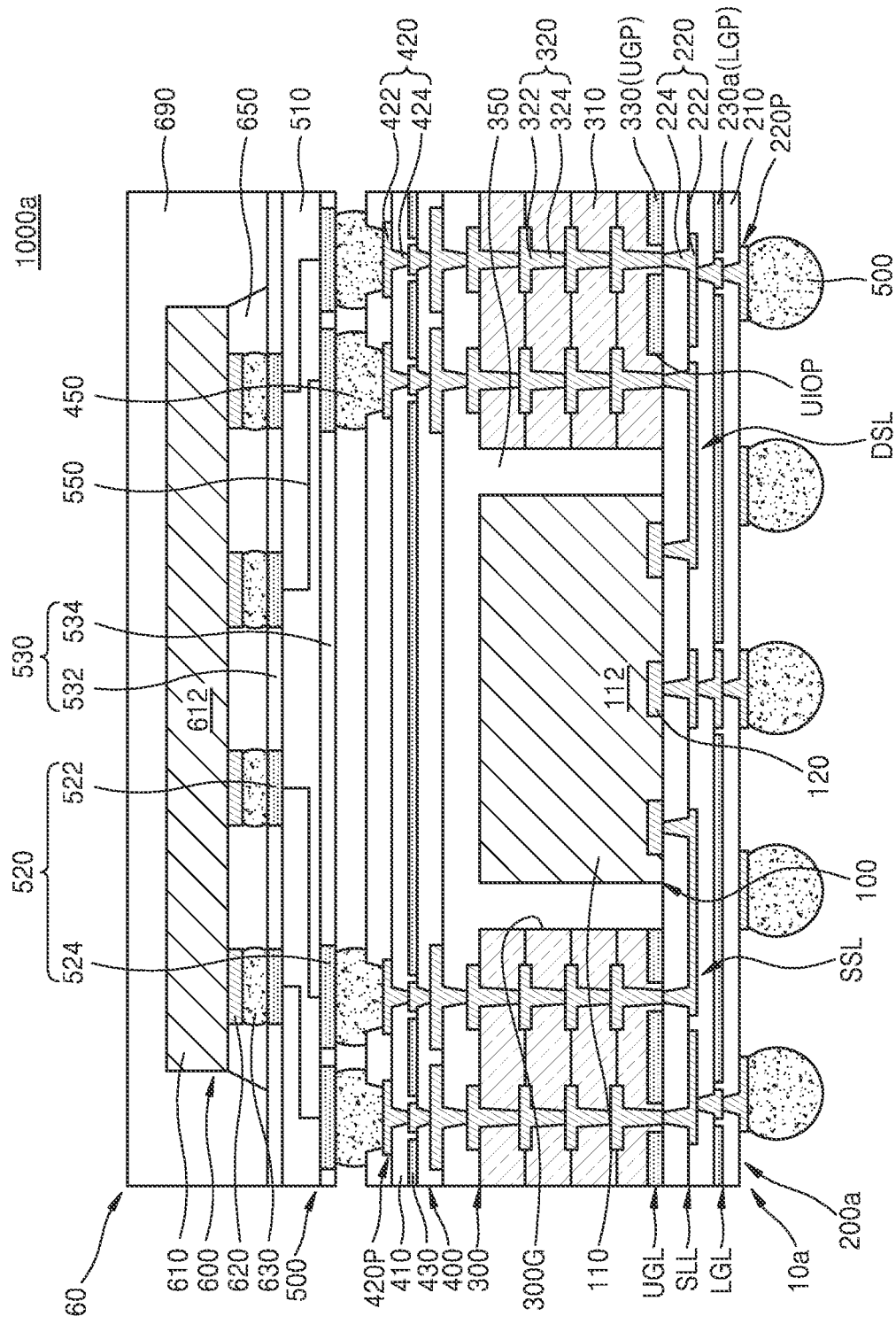
Figure 6C:
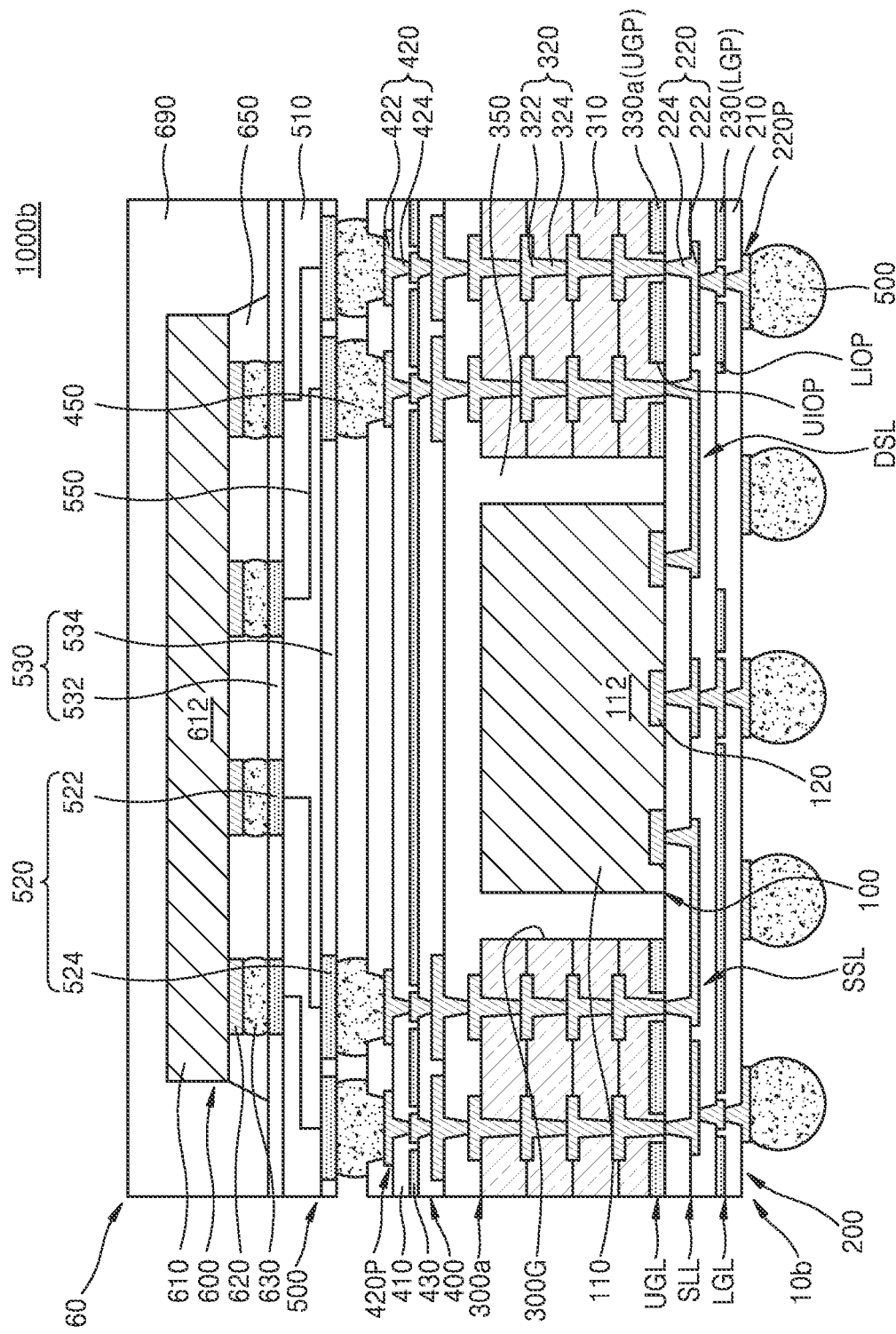

FIGS. 6A to 6C are cross-sectional views of PoPs having semiconductor packages, according to example embodiments.

Referring to FIG. 6A, a PoP 1000 may include a second semiconductor package 60 stacked on a first semiconductor package 10. The first semiconductor package 10 may be a lower package, and a second semiconductor package 30 may be an upper package. The first semiconductor package 10, a first semiconductor chip 100, a first semiconductor substrate 110, a first semiconductor device 112, and a first chip connection pad 120 may be respectively and substantially the same as the semiconductor package 10, semiconductor chip 100, the semiconductor substrate 110, the semiconductor device 112, and the chip connection pad 120 described with reference to FIG. 3, and thus, detailed descriptions thereof are omitted.

The second semiconductor package 60 may include at least one second semiconductor chip 600. The second semiconductor package 60 may be electrically connected to the first semiconductor package 10 through a plurality of package connection terminals 450, which are adhered to a plurality of package connection pads 420P of the first semiconductor package 10.

The second semiconductor chip 600 may include a second semiconductor substrate 610 having an active surface on which a second semiconductor device 612 is formed and a plurality of second chip connection pads 620 on the active surface of the second semiconductor substrate 610. The second semiconductor substrate 610, the second semiconductor device 612, and the second chip connection pad 620 may be respectively and substantially similar to the semiconductor substrate 110, the semiconductor device 112, and the chip connection pad 120 described with reference to FIG. 3, repeated descriptions thereof are omitted. The at least one second semiconductor chip 600 may be a memory semiconductor chip. The second semiconductor chip 600 may include, for example, a DRAM chip, an SRAM chip, a flash memory chip, an EEPROM chip, a PRAM chip, an MRAM chip, or an RRAM chip.

Although FIG. 6A illustrates an example in which the at least one second semiconductor chip 600 included in the second semiconductor package 60 is mounted on a package base substrate 500 using a flip-chip method, embodiments are not limited thereto. The PoP 1000 may include, as an upper package, any type of semiconductor package, which includes the at least one second semiconductor chip 600 and has the package connection terminals 450 at a lower side thereof to be electrically connected to the first semiconductor package 10.

The package base substrate 500 may include a base board layer 510 and a plurality of board pads 520 on a top surface and a bottom surface of the base board layer 510. The plurality of board pads 520 may include a plurality of board top pads 522 on the top surface of the base board layer 510 and a plurality of board bottom pads 524 on the bottom surface thereof. In example embodiments, the package base substrate 500 may include a PCB. For example, the package base substrate 500 may be a multilayered PCB. The base board layer 510 may include at least one material selected from a phenol resin, an epoxy resin, and a polyimide.

A solder resist layer 530 may be formed on the top surface and the bottom surface of the base board layer 510 to expose the plurality of board pads 520. The solder resist layer 530 may include a top solder resist layer 532 and a bottom solder resist layer 534. The top solder resist layer 532 may cover the top surface of the base board layer 510 and expose the plurality of board top pads 522. The bottom solder resist layer 534 may cover the bottom surface of the base board layer 510 and expose the plurality of board bottom pads 524.

The package base substrate 500 may include a board wiring 550 configured to electrically connect the plurality of board top pads 522 to the plurality of board bottom pads 524 in the base board layer 510. The board wiring 550 may include a board wiring line and a board wiring via. The board wiring 550 may include copper, nickel, stainless steel, or beryllium copper.

The plurality of board top pads 522 may be electrically connected to the second semiconductor chip 600. For example, a plurality of chip connection terminals 630 may be between the plurality of second chip connection pads 620 of the second semiconductor chip 600 and the plurality of board top surfaces 522 of the package base substrate 500, and thus, the second semiconductor chip 600 may be electrically connected to the package base substrate 500. In example embodiments, an under-fill layer 650 may be between the second semiconductor chip 600 and the package base substrate 500 to surround the plurality of chip connection terminals 630. The under-fill layer 650 may include, for example, an epoxy resin formed using a capillary under-fill method. In example embodiments, the under-fill layer 350 may include a non-conductive film (NCF).

A molding layer 690 configured to surround the second semiconductor chip 600 may be on the package base substrate 500. The molding layer 690 may include, for example, an epoxy mold compound (EMC).

The plurality of package connection terminals 450 may be adhered onto the plurality of board bottom pads 524. The plurality of package connection terminals 450 may be between the plurality of package connection pads 420P and the plurality of board bottom pads 524 and electrically connect the first semiconductor package 10 to the second semiconductor package 60.

Referring to FIG. 6B, a PoP 1000a may include a second semiconductor package 60 stacked on a first semiconductor package 10a. The first semiconductor package 10a may be a lower package, and the second semiconductor package 60 may be an upper package. The first semiconductor package 10a may be substantially the same as the semiconductor package 10a described with reference to FIG. 5A, and thus, detailed descriptions thereof are omitted.

Referring to FIG. 6C, a PoP 1000b may include a second semiconductor package 60 stacked on a first semiconductor package 10b. The first semiconductor package 10b may be a lower package, and the second semiconductor package 60 may be an upper package. The first semiconductor package 10b may be substantially the same as the semiconductor package 10b described with reference to FIG. 5B, and thus, detailed descriptions thereof are omitted.

While example embodiments have been particularly shown and described, it will be understood by one of ordinary skill in the art that variations in form and detail may be made therein without departing from the spirit and scope of the attached claims and their equivalents.

What is claimed is:

1. A semiconductor package comprising:
   a pair of differential signal wiring lines in a signal wiring layer, the pair of differential signal wiring lines comprising a first differential signal wiring line and a second differential signal wiring line which extend parallel to and spaced apart from each other;
   a lower equal potential plate in a lower wiring layer that is under the signal wiring layer;
   an upper equal potential plate in an upper wiring layer that is above the signal wiring layer opposite to the lower equal potential plate; and
   a wiring insulating layer adjacent to the pair of differential signal wiring lines, the lower equal potential plate, and the upper equal potential plate,
   wherein the wiring insulating layer fills spaces between the signal wiring layer, the lower wiring layer, and the upper wiring layer, and
   wherein at least one of the lower equal potential plate and the upper equal potential plate comprises an impedance opening which overlaps the pair of differential signal wiring lines in a vertical direction and is filled by the wiring insulating layer.

2. The semiconductor package of claim 1, wherein the impedance opening comprises a lower impedance opening in the lower equal potential plate and an upper impedance opening in the upper equal potential plate, and
   wherein the pair of differential signal wiring lines do not overlap the lower equal potential plate and the upper equal potential plate in the vertical direction.

3. The semiconductor package of claim 2, further comprising:
   a lower redistribution layer comprising the signal wiring layer, the lower wiring layer, a lower redistribution insulating layer, and a lower redistribution conductive structure that comprises the pair of differential signal wiring lines;

an expanded layer comprising the upper wiring layer, a substrate base, a wiring structure, and the upper equal potential plate; and a semiconductor chip on the lower redistribution layer, wherein a lower portion of the wiring insulating layer is a portion of the lower redistribution insulating layer, and an upper portion of the wiring insulating layer is a portion of the substrate base.

4. The semiconductor package of claim 3, wherein the lower impedance opening overlaps the pair of differential signal wiring lines in the vertical direction and extends from a lower side of the semiconductor chip to a lower side of the expanded layer, and wherein the upper impedance opening in the expanded layer overlaps portions of the pair of differential signal wiring lines in the vertical direction.

5. The semiconductor package of claim 3, wherein a material of the lower portion of the wiring insulating layer is different from a material of the upper portion of the wiring insulating layer.

6. The semiconductor package of claim 1, wherein a thickness of the upper equal potential plate is greater than a thickness of the lower equal potential plate.

7. The semiconductor package of claim 1, wherein the impedance opening comprises a lower impedance opening in the lower equal potential plate, and wherein the pair of differential signal wiring lines overlap the upper equal potential plate in the vertical direction and do not overlap the lower equal potential plate in the vertical direction.

8. The semiconductor package of claim 1, wherein the impedance opening comprises an upper impedance opening in the upper equal potential plate, and wherein the pair of differential signal wiring lines overlap the lower equal potential plate in the vertical direction and do not overlap the upper equal potential plate in the vertical direction.

9. The semiconductor package of claim 1, further comprising an equal potential bridge extending to bisect the impedance opening, the equal potential bridge being integrally formed with at least one of the lower equal potential plate and the upper equal potential plate.

10. The semiconductor package of claim 9, wherein the equal potential bridge overlaps a space between the first differential signal wiring line and the second differential signal wiring line in the vertical direction.

11. A semiconductor package comprising:
a lower redistribution layer comprising:
a plurality of lower redistribution line patterns;
a plurality of lower redistribution via patterns;
a lower equal potential plate;
a lower redistribution insulating layer adjacent to the plurality of lower redistribution line patterns, the plurality of lower redistribution via patterns, and the lower equal potential plate;
a signal wiring layer; and
a lower wiring layer under the signal wiring layer,
wherein a pair of differential signal wiring lines are portions of the plurality of lower redistribution line patterns in the signal wiring layer, and the lower equal potential plate is in the lower wiring layer, and
wherein the pair of differential signal wiring lines comprise a first differential signal wiring line and a second differential signal wiring line, which extend spaced apart from each other;

an expanded layer overlapping portions of the pair of differential signal wiring lines in a vertical direction, the expanded layer comprising:
a substrate base having a mounting space;
a plurality of wiring patterns and an upper equal potential plate on at least one of a top surface and a bottom surface of the substrate base;
a plurality of conductive vias passing through at least a portion of the substrate base; and
an upper wiring layer in which the upper equal potential plate is provided, the upper wiring layer being above the signal wiring layer; and
a semiconductor chip in the mounting space on the lower redistribution layer,
wherein the lower equal potential plate and the upper equal potential plate respectively have a lower impedance opening and an upper impedance opening, and
wherein the lower impedance opening and the upper impedance opening overlap at least portions of the pair of differential signal wiring lines in the vertical direction.

12. The semiconductor package of claim 11, wherein the lower redistribution layer further comprises a single signal wiring line in the signal wiring layer, the single signal wiring line being spaced apart from the pair of differential signal wiring lines, and wherein the single signal wiring line overlaps the lower equal potential plate and the upper equal potential plate in the vertical direction.

13. The semiconductor package of claim 11, wherein the lower impedance opening overlaps the pair of differential signal wiring lines in the vertical direction and extends from a lower side of the semiconductor chip to a lower side of the expanded layer, and wherein the upper impedance opening in the expanded layer overlaps portions of the pair of differential signal wiring lines and a portion of the lower impedance opening in the vertical direction.

14. The semiconductor package of claim 11, wherein the lower redistribution layer further comprises a lower equal potential bridge extending to bisect the lower impedance opening, the lower equal potential bridge being integrally formed with the lower equal potential plate, wherein the expanded layer further comprises an upper equal potential bridge extending to bisect the upper impedance opening, the upper equal potential bridge being integrally formed with the upper equal potential plate, and wherein the lower equal potential bridge and the upper equal potential bridge overlap a space between the first differential signal wiring line and the second differential signal wiring line in the vertical direction.

15. The semiconductor package of claim 14, wherein a distance between the first differential signal wiring line and the second differential signal wiring line is greater than or equal to a lateral width of each of the lower equal potential bridge and a width of the upper equal potential bridge in a horizontal direction.

16. The semiconductor package of claim 11, wherein the pair of differential signal wiring lines electrically connect the semiconductor chip to the plurality of wiring patterns and portions of the plurality of conductive vias.

17. The semiconductor package of claim 11, wherein the lower redistribution layer further comprises a surrounding equal potential plate in the signal wiring layer, the surrounding equal potential plate having a differential signal opening, wherein the pair of differential signal wiring lines is spaced apart from the surrounding equal potential plate in the differential signal opening, and wherein a lateral width of the differential signal opening in a direction perpendicular to a direction in which the pair of differential signal wiring lines extend is less than a lateral width of the lower impedance opening and a lateral width of the upper impedance opening.

18. A semiconductor package-on-package comprising:
a first semiconductor package comprising:
a lower redistribution layer comprising:
  a surrounding equal potential plate comprising a differential signal opening;
  a signal wiring layer in the differential signal opening;
  a lower wiring layer comprising a lower equal potential plate, under the signal wiring layer;
  a pair of differential signal wiring lines in the signal wiring layer, the pair of differential signal wiring lines comprising a first differential signal wiring line and a second differential signal wiring line, which extend spaced apart from each other; and
  a lower redistribution insulating layer adjacent to the surrounding equal potential plate, the pair of differential signal wiring lines, and the lower equal potential plate;
an expanded layer overlapping portions of the pair of differential signal wiring lines in a vertical direction on the lower redistribution layer, the expanded layer comprising:
  a substrate base comprising a mounting space;
  a plurality of wiring patterns and an upper equal potential plate on at least one of a top surface of the substrate base and a bottom surface of the substrate base; and
  a plurality of conductive vias passing through at least a portion of the substrate base,
  an upper wiring layer in which the upper equal potential plate is provided above the signal wiring layer;
a first semiconductor chip in the mounting space on the lower redistribution layer; and
an upper redistribution layer on the expanded layer and the first semiconductor chip, the upper redistribution layer comprising:
  a plurality of upper redistribution line patterns;
  a plurality of upper redistribution via patterns; and
  an upper redistribution insulating layer adjacent to the plurality of upper redistribution line patterns and the plurality of upper redistribution via patterns; and
a second semiconductor package comprising:

a second semiconductor chip electrically connected to the first semiconductor chip through the pair of differential signal wiring lines; and
package connection terminals on to package connection pads to electrically connect the second semiconductor chip to the first semiconductor package,
wherein the second semiconductor package is on the first semiconductor package, and
wherein the package connection pads are portions of the plurality of upper redistribution via patterns,
wherein the lower equal potential plate and the upper equal potential plate respectively have a lower impedance opening and an upper impedance opening which overlap at least portions of the pair of differential signal wiring lines in the vertical direction,
wherein the lower redistribution layer further comprises a lower equal potential bridge extending to bisect the lower impedance opening, the lower equal potential bridge being integrally formed with the lower equal potential plate,
wherein the expanded layer further comprises an upper equal potential bridge extending to bisect the upper impedance opening, the upper equal potential bridge being integrally formed with the upper equal potential plate, and
wherein the lower equal potential bridge and the upper equal potential bridge overlap a space between the first differential signal wiring line and the second differential signal wiring line in the vertical direction.

19. The semiconductor package-on-package of claim 18, wherein a lateral width of the lower equal potential bridge and a lateral width of the upper equal potential bridge ranges from 3 μm to 15 μm, which is less than or equal to a distance between the first differential signal wiring line and the second differential signal wiring line.

20. The semiconductor package-on-package of claim 18, wherein the surrounding equal potential plate and the pair of differential signal wiring lines have a first thickness, the upper equal potential plate and the upper equal potential bridge have a second thickness, and the lower equal potential plate and the lower equal potential bridge have a third thickness,
wherein the second thickness is greater than the first thickness, and the third thickness is less than the second thickness, and
wherein the first thickness and the third thickness ranges from 2 μm to 9 μm, and the second thickness ranges from 10 μm to 30 μm.

* * * * *